United States Patent [19]
Sugimoto

[11] Patent Number: 6,016,084

[45] Date of Patent: Jan. 18, 2000

[54] METHOD FOR CONNECTING PRINTED CIRCUIT BOARD WITH HOUSING, AND ELECTRONIC INSTRUMENT HAVING CONNECTION STRUCTURE ACCORDING TO THE CONNECTING METHOD

[75] Inventor: Satoshi Sugimoto, Yokohama, Japan

[73] Assignee: Canon Kabushiki Kaisha, Tokyo, Japan

[21] Appl. No.: 08/994,563

[22] Filed: Dec. 19, 1997

[30] Foreign Application Priority Data

Dec. 27, 1996 [JP] Japan ................................. 8-349523
Feb. 25, 1997 [JP] Japan ................................. 9-040514

[51] Int. Cl.<sup>7</sup> ................................. H03H 7/01
[52] U.S. Cl. ................................. 333/12; 361/818
[58] Field of Search ................................. 333/12; 361/816, 361/818

[56] References Cited

U.S. PATENT DOCUMENTS

| | | | |
|---|---|---|---|
| 4,563,660 | 1/1986 | McNeilly | 333/12 X |
| 5,208,560 | 5/1993 | Yasutake | 333/12 |
| 5,351,018 | 9/1994 | Lehmann et al. | 333/12 |
| 5,686,871 | 11/1997 | Baran | 333/12 |
| 5,717,359 | 2/1998 | Matsui et al. | 333/12 X |
| 5,841,202 | 11/1998 | Noguchi et al. | 333/12 X |

FOREIGN PATENT DOCUMENTS

| | | |
|---|---|---|
| 59-111403 | 6/1984 | Japan ................................. 333/12 |
| 7-225634 | 8/1995 | Japan . |

OTHER PUBLICATIONS

H.W. Ott, "Noise Reduction Techniques in Electronic Systems", Second Edition, Jun. 1988, pp. 315–321.

*Primary Examiner*—Justin P. Bettendorf
*Attorney, Agent, or Firm*—Fitzpatrick, Cella, Harper & Scinto

[57] ABSTRACT

A ground pattern of a printed circuit board of an electronic instrument is connected with a conductive part of a housing of the instrument by a series combination of components respectively having the inductive nature and capacitive nature, or by a series combination of components respectively having the resistive nature and capacitive nature, or by a series combination of components respectively having the inductive nature, capacitive nature, and resistive nature. In this way the impedance can be adjusted against frequency so as to be ready for the frequency where the standing wave appears, the resonance frequency of LC series circuit, and harmonic frequencies of electric current flowing on the circuit board. In another arrangement, the ground pattern of a printed circuit board is connected with the conductive part of the housing of instrument through a plurality of separate connection paths with different impedances.

21 Claims, 22 Drawing Sheets

LC SERIES CIRCUIT

RC SERIES CIRCUIT

RLC SERIES CIRCUIT

METHOD FOR CONNECTING PRINTED CIRCUIT BOARD WITH HOUSING, AND ELECTRONIC INSTRUMENT HAVING CONNECTION STRUCTURE ACCORDING TO THE CONNECTING METHOD

BACKGROUND OF THE INVENTION

1. Field of the Invention

The present invention relates to a method for connecting a printed circuit board with a conductive part of a housing, for suppressing radiant noise from electronic equipment, and to an electronic instrument having the connection structure according to the connecting method.

2. Related Background Art

For suppressing the transmission noise and radiant noise of electronic equipment, it is necessary to decrease potential variation of the ground provided in the printed circuit board. This is because the radiant noise and transmission noise is suppressed by stabilizing the potential of the ground and thereby stopping generation of unwanted current.

The methods for connecting the printed circuit board with the conductive part of the housing in which the printed circuit board is mounted are examples of methods for stabilizing the ground potential of the printed circuit board. In such methods a normal connecting method is as shown by the potion of connection to the external ground in "Jissen noise teigen giho (Practical noise decreasing techniques)," (Jatech Shuppan), p. 342, FIG. 11 to FIG. 16, wherein the connection with the conductive part of the housing as the external ground with stable voltage change is such that the connecting portion has low impedance. In this case, however, the electric current flowing in the printed circuit board and the conductive part of the housing generates a standing wave at a specific frequency determined by the impedance of the circuit board to the conductive part of the housing, which accounts for the radiant noise.

FIG. 29 is a partial side view of a connecting portion of printed circuit board with the housing in a conventional example, wherein reference numeral 111 designates the printed circuit board, 112 the conductive part of the housing, and 113 a connecting screw of the printed circuit board.

For example, as shown in FIG. 29, there is a metal plate as part of the housing conductive part 112 immediately below the printed circuit board 111. When the printed circuit board 111 is connected at both ends thereof with the housing conductive part 112, the standing wave appears at a frequency where the length of board is equal to a multiple of a half wave, and this standing wave is the cause of very large radiant noise.

In the case wherein the housing conductive part is located immediately below the printed circuit board and wherein the ground portion of the printed circuit board and the housing conductive part are connected with high impedance, connection between them decreases the radiant noise at most of frequencies. In this case, however, the electric current flowing on the circuit board also generates the standing wave at a specific frequency determined by the size and dielectric of the circuit board, and it is also the cause of the radiant noise.

The conventional methods for suppressing the standing wave include a method for connecting them at plural positions and thus decreasing the intervals of connection between the connecting positions, and a method for providing the connecting portion with resistive nature as described in Japanese Laid-open Patent Application No. 7-225634.

The former method of multipoint connection is a method for changing the apparent size of the circuit board to shorten the wavelength of the standing wave generated, thereby changing the frequency into the high frequency range. The latter method for providing the connecting portion with resistive nature is a method for suppressing the electric current flowing in the connecting portion and matching the impedance of the circuit board with that of the housing conductive part to eliminate reflection, thereby suppressing the standing wave.

The conventional examples described above, however, had the following problems. The method of multipoint connection requires the increased number of components and the increased area for connection, and there are some cases where a large space cannot be used for connection to the housing from the restriction of wiring. Further, low-frequency current or DC current is likely to flow into the connecting portion from the outside, thus posing the problem of immunity.

When the connecting portion is provided with the resistive nature, the impedance must be a certain fixed value at the frequency where the standing wave appears, for suppressing the increase of noise due to the standing wave phenomenon. In that case, the impedance of the connecting portion is also the fixed value at the frequencies except for that of the standing wave, and there are some cases where suppression of current does not occur well in all of the frequency bands necessitating the countermeasures against the radiant noise. In that case there is such a possibility that the ground current undesirably flows into the connecting portion so as to be the cause of the radiant noise.

Further, when the connecting portion is provided with the resistive nature, the increase of noise due to the standing wave can be prevented, while it is difficult to adjust the impedance of the connecting portion according to change in frequency, because the fixed value is selected for the resistance from the need for impedance matching. In ordinary printed circuit boards, matching values are approximately several ten $\Omega$ in many cases, and in some cases the suppression of noise is not effected in the frequency bands necessitating the countermeasures against the radiant noise.

Particularly, for example, in the low frequency range of 300 MHz or less, a good result is obtained by connection with higher impedance than the matching value; for example, in the high frequency range of 700 MHz or more, better radiant noise characteristics are shown by connection with lower impedance than the matching value.

When the ground of the circuit board is connected with the conductive part of the housing through a series configuration of R, L, and C, actual components are affected by parasitic capacitance or parasitic inductance at the frequencies of the several hundred MHz order, and it is thus difficult to ideally change the frequency characteristics of the impedance of LC series circuit. This results in making it difficult to achieve the impedance matching at the frequency of standing wave and to avoid the increase of radiant noise due to resonance.

SUMMARY OF THE INVENTION

An object of the present invention is to solve the above problems and thereby to provide a method for connecting the printed circuit board with the conductive part of the housing while suppressing the standing wave generated by the connection to the housing and also effectively suppressing the radiant noise throughout a wide frequency band, and an electronic instrument having the connection structure according to the connecting method.

Another object of the present invention is to provide a method for connecting the printed circuit board with the conductive part of the housing while permitting adjustment of impedance of connecting portion against for frequency, and an electronic instrument having the connection structure according to the connecting method.

Other objects of the present invention will become more apparent by the specific embodiments which will be described below.

BRIEF DESCRIPTION OF THE DRAWINGS

FIGS. 2A and 2B are explanatory drawings of an LC series circuit shown in FIG. 1, wherein FIG. 2A is an equivalent circuit diagram and FIG. 2B is a graph to diagrammatically show variation of impedance against frequency;

FIGS. 3A and 3B are explanatory drawings of an RC series circuit used in place of the LC circuit shown in FIG. 1, wherein FIG. 3A is an equivalent circuit diagram and FIG. 3B is a graph to diagrammatically show variation of impedance against frequency;

FIGS. 4A and 4B are explanatory drawings of an RLC series circuit used in place of the LC circuit shown in FIG. 1, wherein FIG. 4A is an equivalent circuit diagram and FIG. 4B is a graph to diagrammatically show variation of impedance against frequency;

DESCRIPTION OF THE PREFERRED EMBODIMENTS

The embodiments of the present invention will be described by reference to the drawings.

(First Embodiment)

Figure 1:
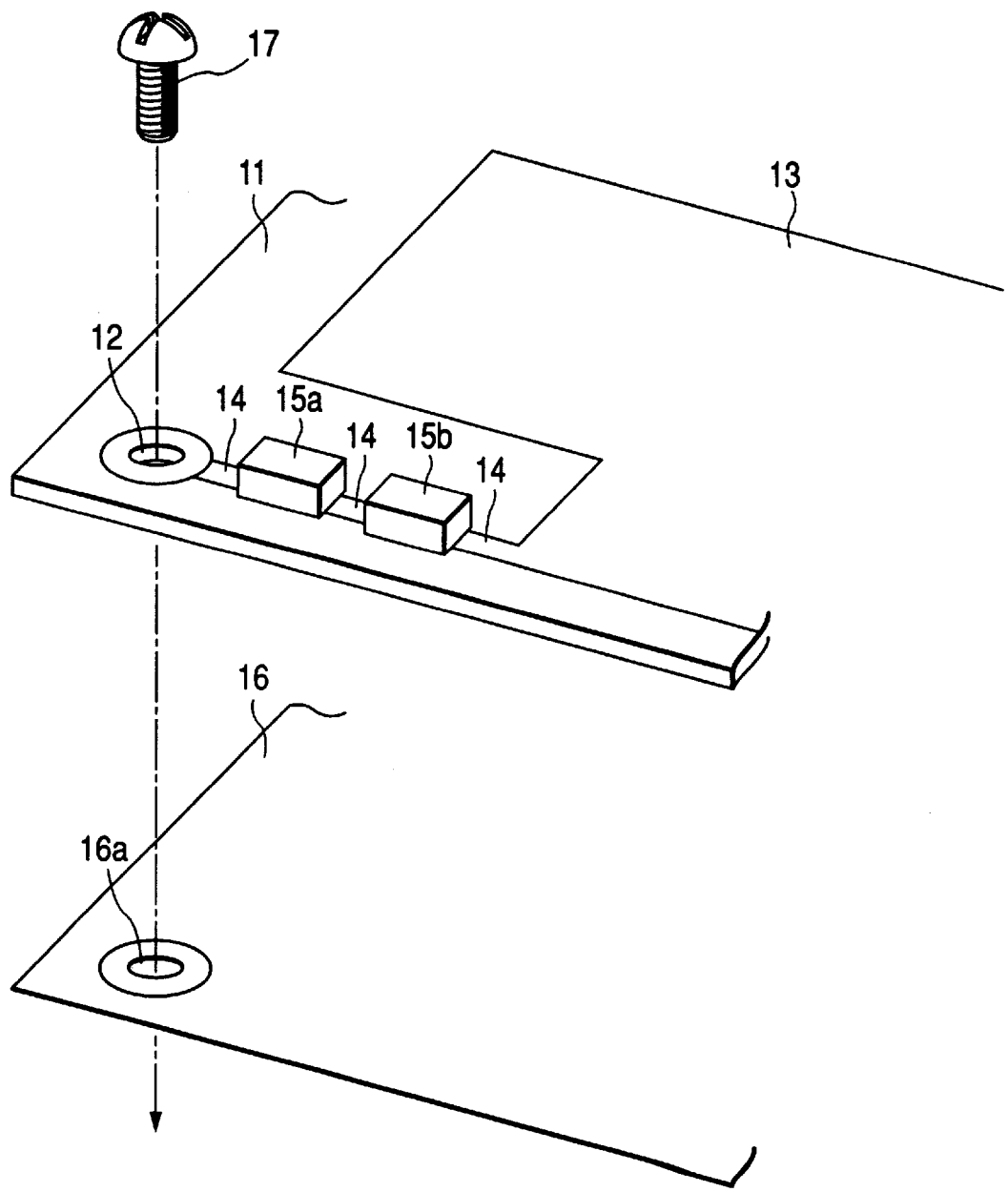
FIG. 1 is a perspective view of a connecting portion of a printed circuit board with a housing in the first embodiment.

FIG. 1 shows the connecting portion of a printed circuit board with the housing according to the first embodiment of the present invention. In the drawing reference numeral 11 designates a printed circuit board, 12 a land hole for a connecting screw of printed circuit board, 13 a ground pattern, 14 lands for mounting of chip type component, 15a a chip type inductor, and 15b a chip type capacitor. Numeral 16 denotes a conductive part of the housing, 16a a mounting hole, and 17 a screw.

In the first embodiment of the present invention, the ground portion of printed circuit board and the conductive part of instrument housing are connected by a series combination of components respectively having the inductive nature and capacitive nature; or by a series combination of components respectively having the resistive nature and capacitive nature; or by a series combination of components respectively having the inductive nature, capacitive nature, and resistive nature.

In FIG. 1 the ground pattern 13 of printed circuit board 11 and the conductive part 16 of the instrument housing are connected by the LC series circuit configured as a series combination of the chip type inductor 15a having the inductive nature and the chip type capacitor 15b having the capacitive nature.

The printed circuit board 11 is connected to the conductive part 16 of the housing through their land holes 12, 16a with the screw 17 so as to be electrically conductive.

In addition to the LC series circuit of the combination of the component with the capacitive nature and the component with the inductive nature shown in FIG. 1, the first embodiment of the present invention may adopt an RC series circuit as a combination of a component with the capacitive nature and a component with the resistive nature and an RLC series circuit as a combination of a component with the inductive nature, a component with the capacitive nature, and a component with the resistive nature, as described hereinafter.

Figure 2A:
Figure 2B:
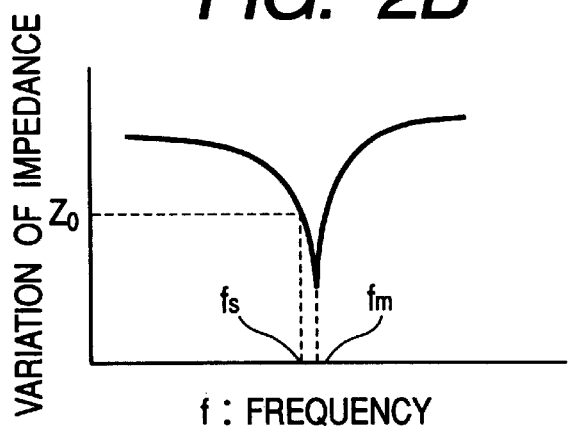
Figure 3A:
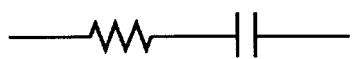
Figure 3B:
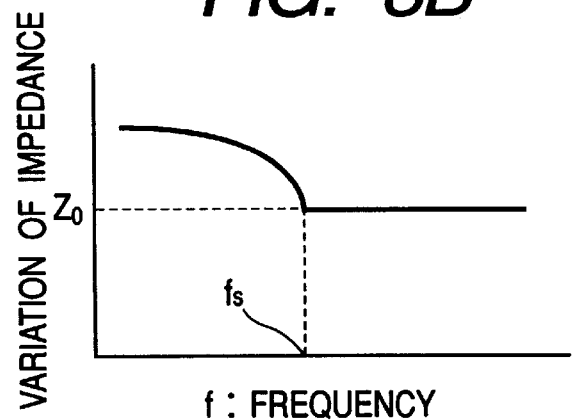
Figure 4A:
Figure 4B:
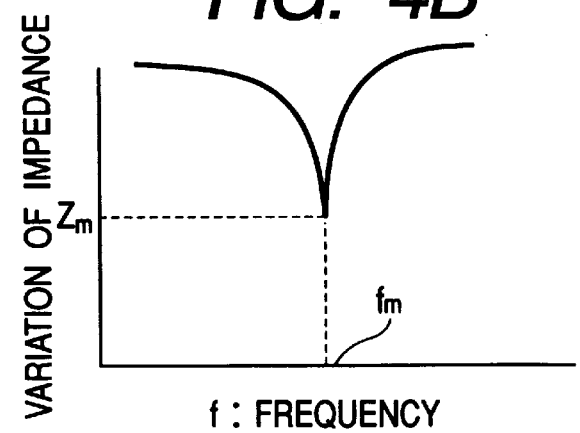

FIGS. 2A and 2B are explanatory drawings of the LC series circuit, wherein FIG. 2A is an equivalent circuit diagram and FIG. 2B a graph to diagrammatically show the variation of impedance against frequency. FIGS. 3A and 3B are explanatory drawings of the RC series circuit, wherein FIG. 3A is an equivalent circuit diagram and FIG. 3B a graph to diagrammatically show the variation of impedance against frequency. FIGS. 4A and 4B are explanatory drawings of the RLC series circuit, wherein FIG. 4A is an equivalent circuit diagram and FIG. 4B a graph to diagrammatically show the variation of impedance against frequency.

In the configuration of the LC circuit as shown in the circuit diagram of FIG. 2A, the impedance of the connecting portion has the frequency characteristics as shown in FIG. 2B, so that the impedance can be adjusted against frequency.

The radiant noise due to the standing wave and the radiant noise due to the LC resonance can be suppressed by such selection that values of L and C are determined to match the impedance of the LC circuit with the impedance of the printed circuit board with respect to the conductive part of the housing at the frequency fs at which the standing wave due to the size of the printed circuit board or the like appears and that the resonance frequency fm of the LC series circuit does not include harmonic frequencies of signals flowing on the circuit board.

When the LC series circuit is configured in the connecting portion as described above, the impedance is kept high at the frequencies except for fs and fm, so that the radiant noise caused by the electric current flowing through the connecting portion into the conductive part of the housing can be suppressed.

In the case where the LC series circuit is replaced by the RC series circuit shown by the equivalent circuit of FIG. 3A, the impedance characteristics are as shown in FIG. 3B, wherein the capacitive nature acts particularly in the low frequency region to keep the impedance high, whereby the radiant noise can be effectively suppressed in the low frequency region.

Further, when the electric current flowing on the circuit board has various frequency components, the RLC series circuit shown in FIG. 4A is employed, whereby the impedance value Zm at the resonance frequency fm shown in FIG. 4B can be selected readily, thus facilitating optimization of impedance.

As described above, the radiant noise can be effectively suppressed in such a manner that a certain fixed impedance is given at the frequency where the standing wave occurs and that the impedance is kept high in the frequency region except for that, thereby adjusting the flow of current from the ground pattern of the printed circuit board to the conductive part of housing in the broad frequency band.

In FIG. 1 to show the first embodiment, the land hole 12 for screw for connection with the conductive part of the housing is provided in a part of the printed circuit board 11 in connection with the ground pattern 13; the ground pattern 13 for connection near this land hole 12 is discontinuous at two portions; the mounting lands 14 are provided so that the chip type inductor 15a and chip type capacitor 15b can be mounted at the discontinuous portions; and the chip type inductor 15a and chip type capacitor 15b are connected by soldering to the mounting lands 14, whereby the ground pattern 13 and the conductive part of the housing are connected through the LC series circuit.

The chip type inductor may be replaced by a chip type resistor to connect them through the RC series circuit.
(Second Embodiment)

Figure 5:
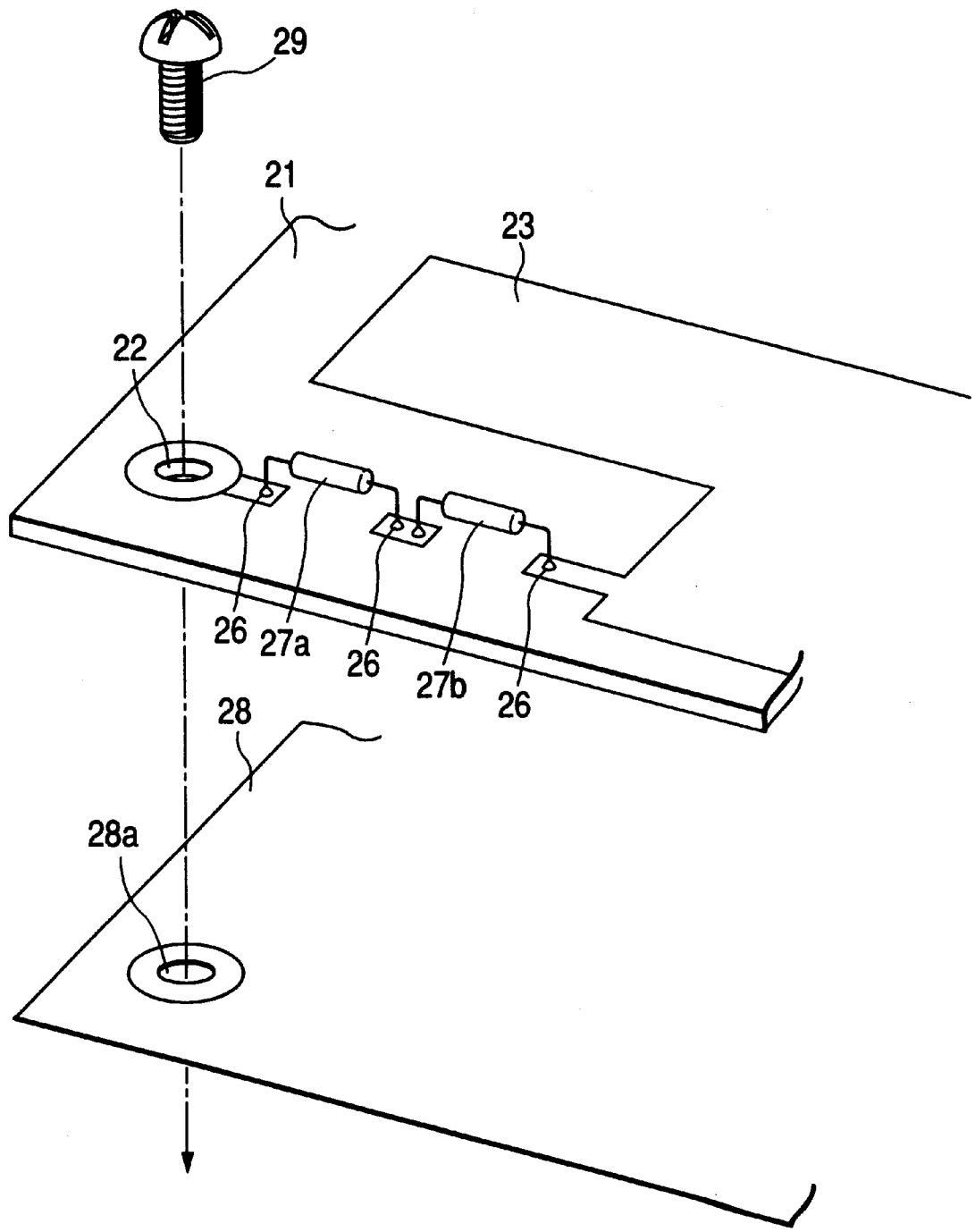
FIG. 5 is a perspective view of a connecting portion of a printed circuit board with a housing in the second embodiment.

FIG. 5 is a partial perspective view of the connecting portion of the printed circuit board with the housing in the second embodiment of the present invention. In the drawing reference numeral 21 designates a printed circuit board, 22 a land hole for a connecting screw of the printed circuit board, 23 a ground pattern, 26 through hole lands, 27a a lead type inductor, and 27b a lead type capacitor. Numeral 28 denotes a conductive part of the housing, 28a a mounting hole, and 29 a screw.

In the LC series circuit of the first embodiment the components mounted on the printed circuit board 11 were of the chip type, but the present embodiment is configured so that the through hole lands 26 are provided instead of the mounting lands 14 in the discontinuous ground pattern 23 and an LC series circuit is formed in the connecting portion, using the lead type inductor 27a and lead type capacitor 27b.

The printed circuit board 21 is connected to the conductive part 28 of the housing through their holes 22, 28 with the screw 29 so as to be electrically conductive.

They may be connected through an RC series circuit using a lead type resistor in place of the lead type inductor.

Further, chip type and lead type components may be mixed in the circuit.
(Third Embodiment)

Figure 6:
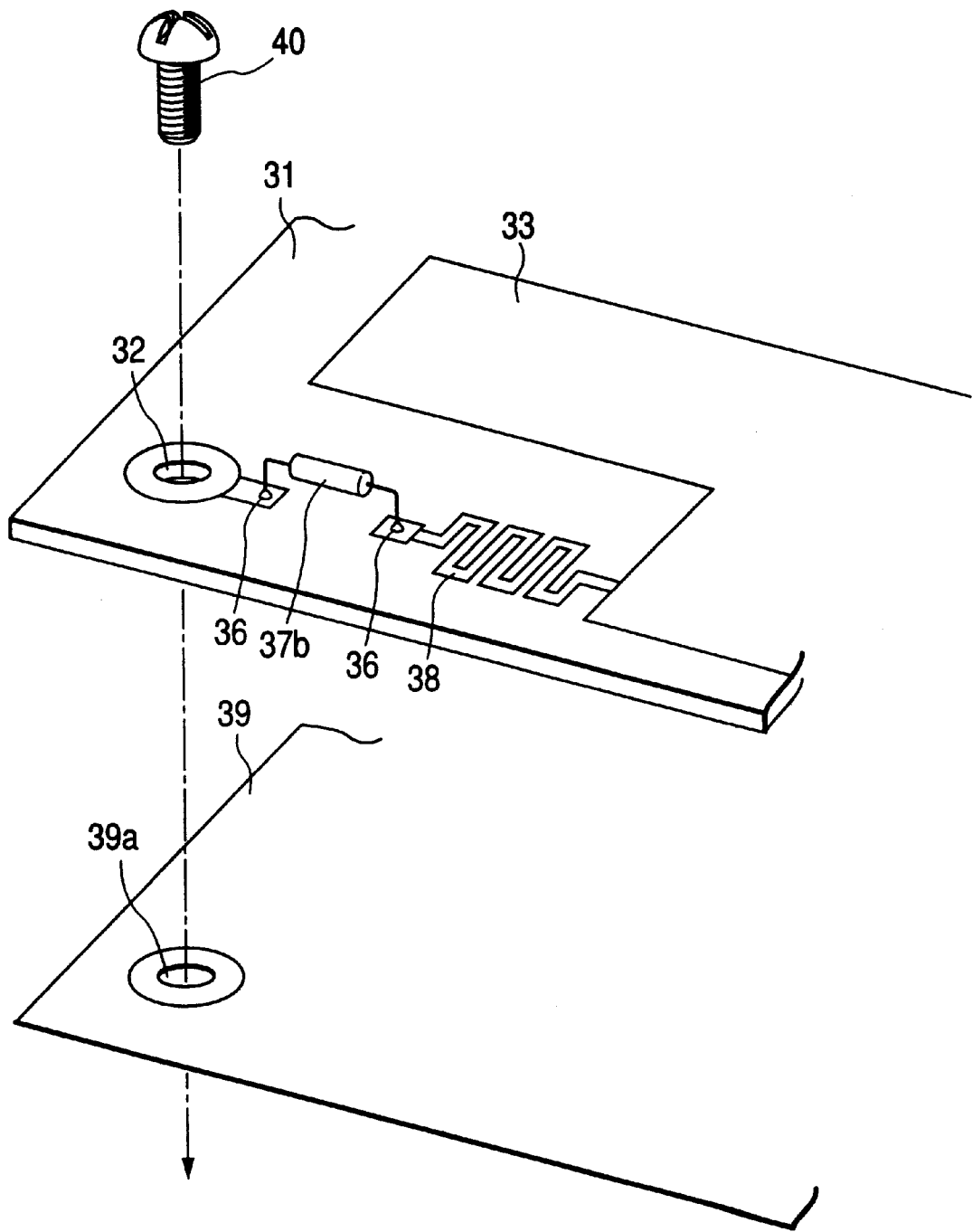
FIG. 6 is a perspective view of a connecting portion of a printed circuit board with a housing in the third embodiment.

FIG. 6 is a partial perspective view of the connecting portion of a printed circuit board with the housing in the third embodiment of the present invention. In the drawing reference numeral 31 denotes a printed circuit board, 32 a land hole for a connecting screw of a printed circuit board, 33 a ground pattern, 36 through hole lands, 37b a lead type capacitor, and 38 a printed inductor of a folded pattern. Numeral 39 denotes a conductive part of the housing, 39a a mounting hole, and 40 a screw.

The land hole 32 for the screw for connection with the conductive part of the housing is provided in a part of the printed circuit board 31 in connection with the ground pattern 33; the ground pattern 33 for connection near this land hole 32 is discontinuous at one portion; the through hole lands 36 are provided in the ground pattern 33 with the discontinuous portion in between; the printed inductor 38 of the folded pattern obtained by processing of the ground pattern 33 is formed in the vicinity of the discontinuous portion in the ground pattern 33 on the opposite side of the discontinuous portion to the land hole 32; and the lead type capacitor 37b is mounted on the through hole lands 36 with the discontinuous portion in between, thus composing an LC series circuit. The printed inductor 38 may be formed in the discontinuous portion of ground pattern 33 on the land hole 32 side, converse to FIG. 6.

The printed circuit board 31 is connected to the conductive part 39 of housing through their holes 32, 39a with the screw 40 so as to be electrically conductive.

Figure 7:
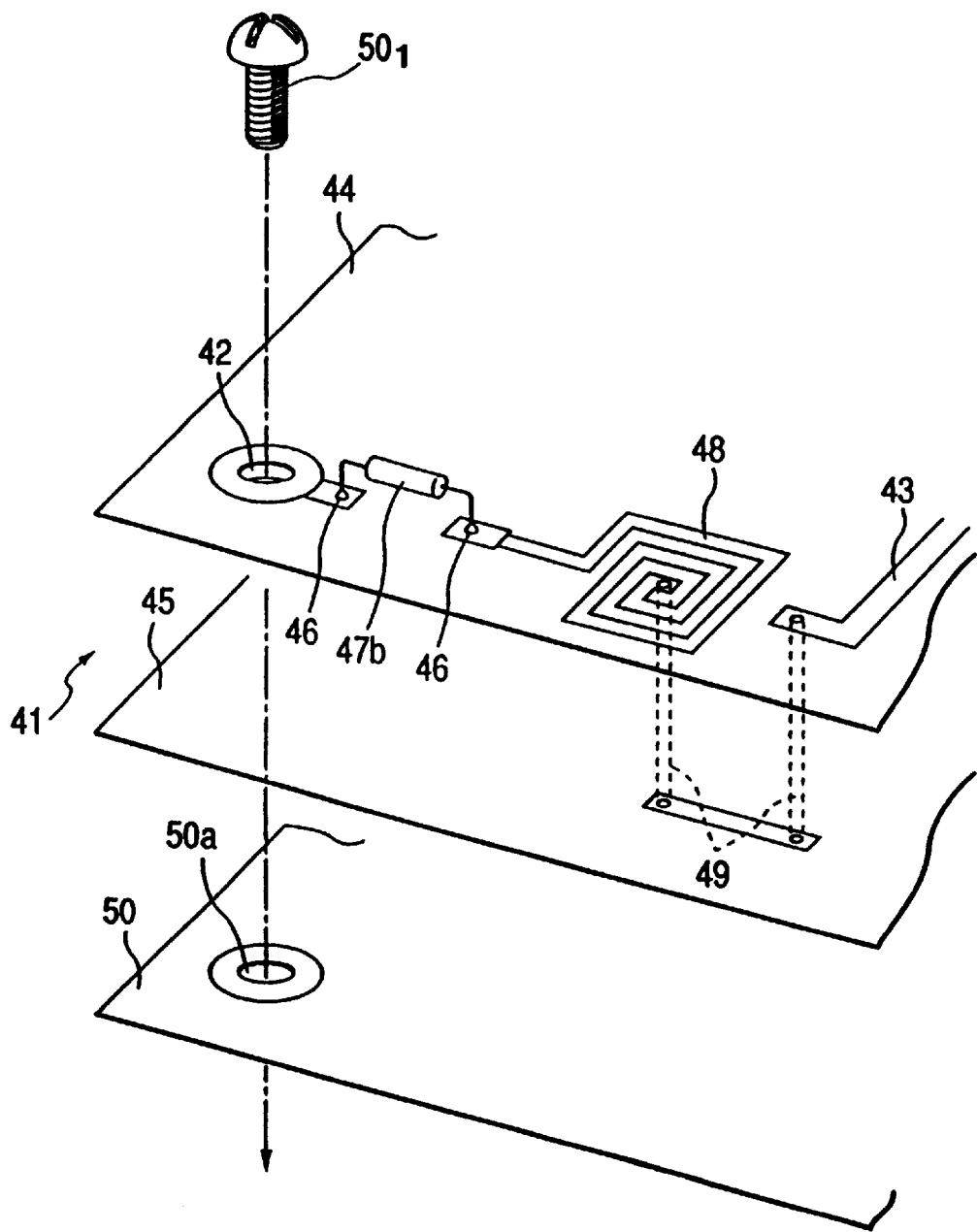
FIG. 7 is a perspective view of a connecting portion of a printed circuit board with a housing in an application example of the third embodiment.

FIG. 7 is a partial perspective view of the connecting portion of a printed circuit board with the housing in an application example of the third embodiment of the present invention. In the drawing reference numeral 41 designates a printed circuit board, 42 a land hole for a connecting screw of printed circuit board, 43 a ground pattern, 44 a first wiring layer in which a printed inductor is formed, 45 a second wiring layer, 46 through hole lands, 47b a lead type capacitor, 48 a printed inductor of a spiral pattern, and 49 through holes. Numeral 50 denotes a conductive part of the housing, 50a a mounting hole, and, 50₁ a screw.

The application example of FIG. 7 employs the printed inductor 48 of the spiral pattern instead of the printed inductor 38 of the folded pattern of FIG. 6. For that, the ground pattern 43 for connection near the land hole 42 is discontinuous at two portions; the through hole lands 46 are provided in the ground pattern 43 with the first continuous portion near the land hole 42 in between; the printed inductor 48 of the spiral pattern obtained by processing of the ground pattern 43 is formed on the second discontinuous portion side of the ground pattern 43 between the first and second, two discontinuous portions; the lead type capacitor 47b is mounted on the through hole lands 46 with the discontinuous portion in between; the through holes 49 are formed from the first wiring layer 44, in which the printed inductor 48 of the spiral pattern is formed, to the second wiring layer 45, starting from the open tip of the printed inductor 48 of the spiral pattern and from the ground pattern 43 faced through the second discontinuous portion to the printed inductor 48 of the spiral shape; and the second wiring layer 45 connects the through holes 49 with each other, thus composing an LC series circuit.

The printed circuit board 41 is connected to the conductive part 50 of the housing through their holes 42, 50a with the screw 50₁ so as to be electrically conductive.

(Fourth Embodiment)

Figure 8:
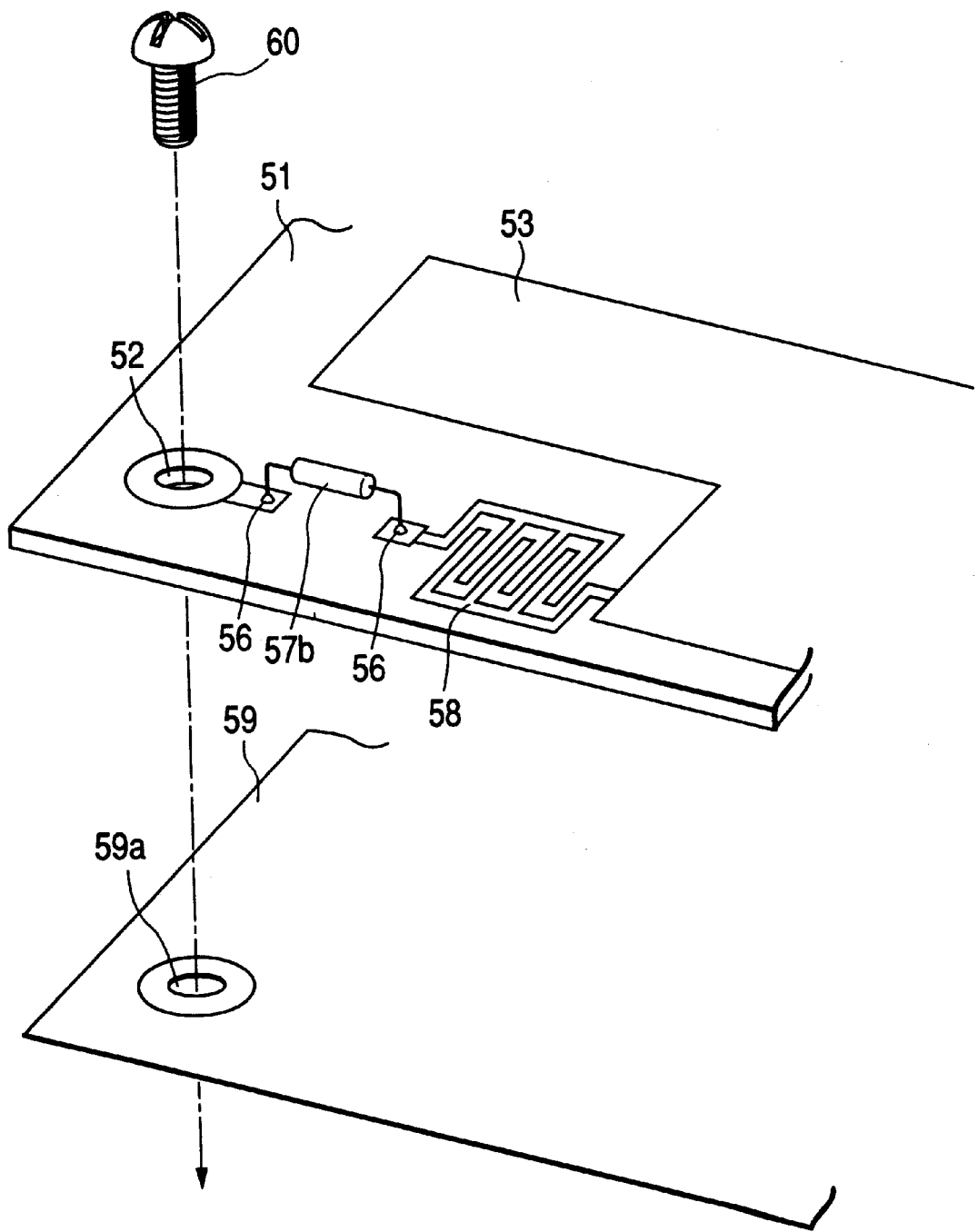
FIG. 8 is a perspective view of a connecting portion of a printed circuit board with a housing in the fourth embodiment.

FIG. 8 is a partial perspective view of the connecting portion of a printed circuit board with the housing in the fourth embodiment of the present invention. In the drawing reference numeral 51 designates a printed circuit board, 52 a land hole for a connecting screw of the printed circuit board, 53 a ground pattern, 56 through hole lands, 57a a lead type inductor, and 58 a printed capacitor of an interdigital pattern. Numeral 59 denotes a conductive part of the housing, 59a a mounting hole, and 60 a screw.

The land hole 52 for screw for connection with the conductive part of the housing is provided in a part of the printed circuit board 51 in connection with the ground pattern 53; the ground pattern 53 for connection near this land hole 52 is discontinuous at one portion; the through hole lands 56 are provided in the ground pattern 53 with the discontinuous portion in between; the printed capacitor 58 of the interdigital pattern obtained by processing of the ground pattern 53 is formed in the vicinity of the discontinuous portion on the opposite side to the land hole 52; and the lead type inductor 57a is mounted on the through hole lands 56 with the discontinuous portion in between, thus composing an LC series circuit. The printed capacitor 58 may be formed in the discontinuous portion of the ground pattern 53 on the land hole 52 side, converse to FIG. 8.

The printed circuit board 51 is connected to the conductive part 59 of the housing through their holes 52, 59a with the screw 60 so as to be electrically conductive.

(Fifth Embodiment)

Figure 9:
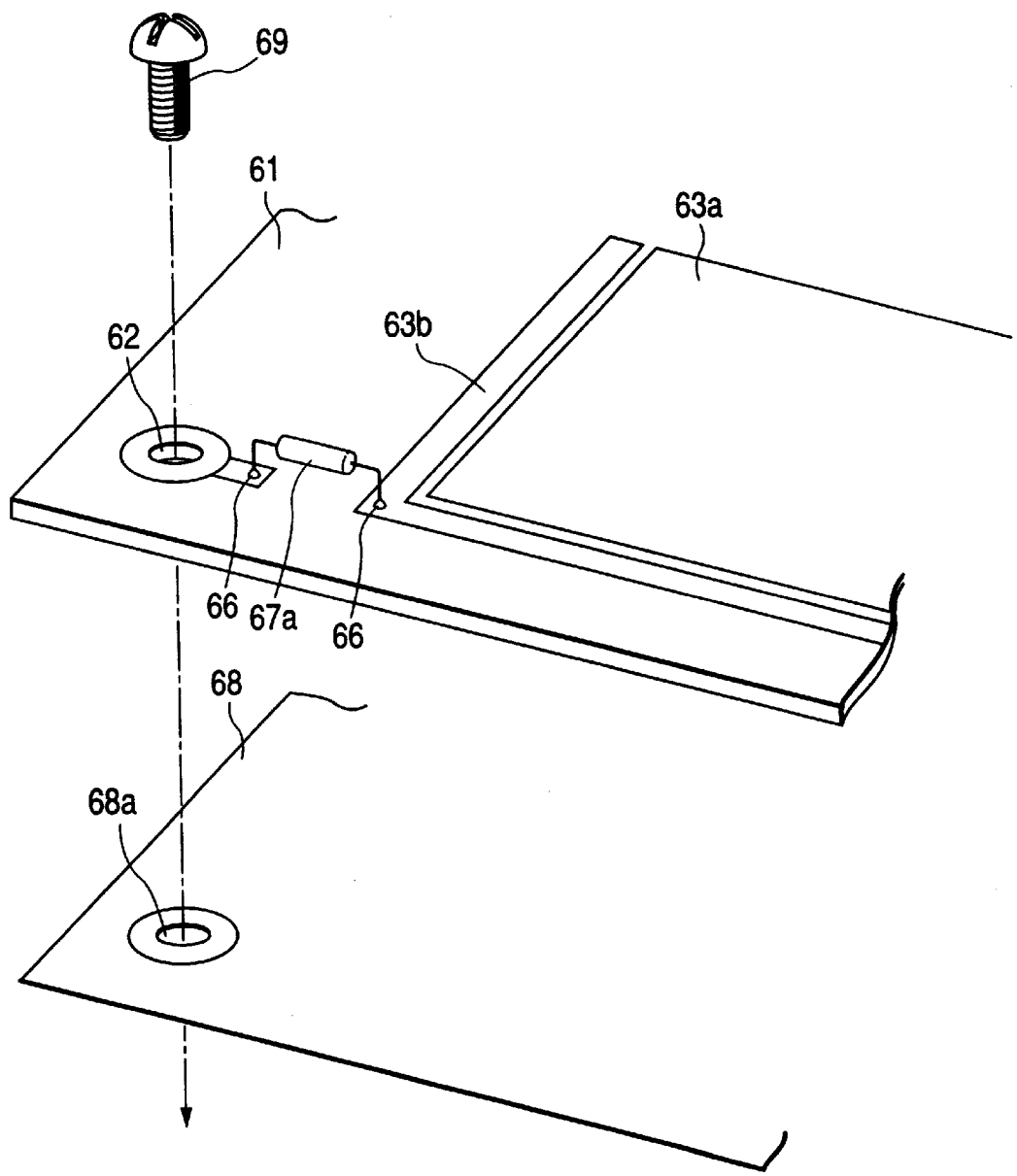
FIG. 9 is a perspective view of a connecting portion of a printed circuit board with a housing in the fifth embodiment.

FIG. 9 is a partial perspective view of the connecting portion of a printed circuit board with the housing in the fifth embodiment of the present invention. In the drawing reference numeral 61 designates a printed circuit board, 62 a land hole for connecting screw of the printed circuit board, 63a a ground pattern for signal, 63b a ground pattern for connection, 66 a through hole land, and 67a a lead type inductor. Numeral 68 denotes a conductive part of the housing, 68a a mounting hole, and 69 a screw.

The ground pattern of the printed circuit board 61 is separated into the signal ground pattern 63a and the connection ground pattern 63b; parts of the signal ground pattern 63a and the connection ground pattern 63b are closely opposed to each other so as to serve as a capacitor; the land hole 62 for the screw for connection with the conductive part of the housing is provided in a part of the printed circuit board 61 in connection with the connection ground pattern 63b; the connection ground pattern 63b near this land hole 62 is discontinuous at one portion; the through hole land 66 is provided in the connection ground pattern 63b with the discontinuous portion in between; and the lead type inductor 67a is mounted on the through hole land 66 with the discontinuous portion in between, thus composing an LC series circuit.

The printed circuit board 61 is connected to the conductive part 68 of housing through their holes 62, 68a with the screw 69 so as to be electrically conductive.

(Sixth Embodiment)

Figure 10:
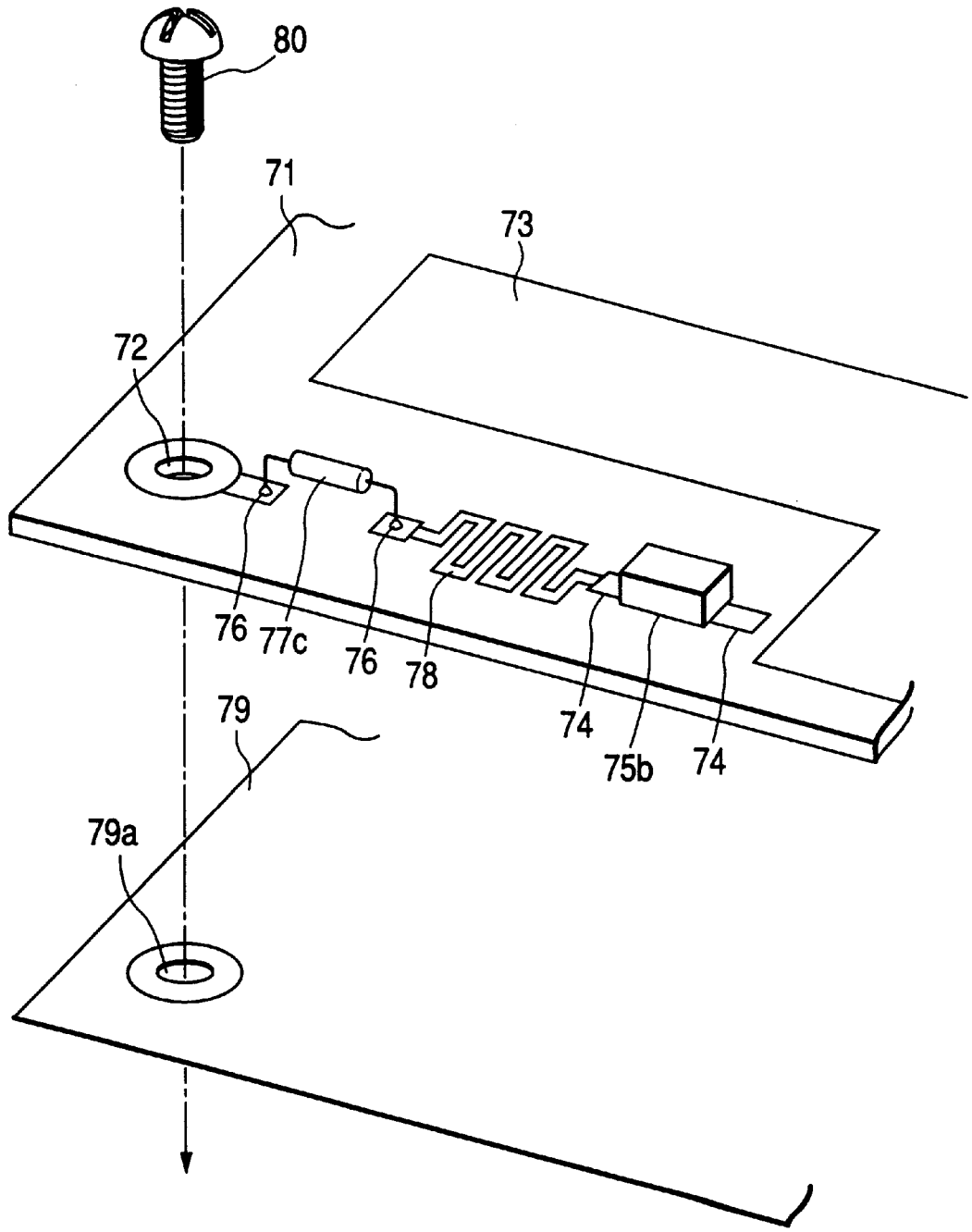
FIG. 10 is a perspective view of a connecting portion of a printed circuit board with a housing in the sixth embodiment.

FIG. 10 is a partial perspective view of the connecting portion of a printed circuit board with the housing in the sixth embodiment of the present invention. In the drawing reference numeral 71 designates a printed circuit board, 72 a land hole for a connecting screw of the printed circuit board, 73 a ground pattern, 74 mounting lands, 75b a chip type capacitor, 76 through hole lands, 77c a lead type resistor, and 78 a printed inductor of a folded pattern. Numeral 79 denotes a conductive part of the housing, 79a a mounting hole, and 80 a screw.

The land hole 72 for the screw for connection with the conductive part of the housing is formed in a part of the printed circuit board 71 in connection with the ground pattern 73; the ground pattern 73 for connection near this land hole 72 is discontinuous at two portions; the connection ground pattern 73 is provided with the mounting lands 74 on either side of the second continuous portion more distant from the land hole 72 and with the through hole lands 76 on which the lead type resistor can be mounted, on either side of the first discontinuous portion near the land hole 72; the printed inductor 78 of the folded pattern is formed by processing of the ground pattern 73 between the first and second discontinuous portions; the chip type capacitor 75b is mounted by soldering on the mounting lands 74 with the second discontinuous portion in between; and the lead type resistor 77c is mounted by soldering on the through hole lands 76 with the first discontinuous portion in between, thus composing an RLC series circuit for connecting the printed circuit board 71 with the conductive part of housing. The sequence of the chip type capacitor 75b, the lead type resistance 77c, and the printed inductor 78 may be changed to one different from that in FIG. 10. Each component may be either one of the chip type, the lead type, and the printed type. The printed circuit board 71 is connected to the conductive part 79 of the housing through their holes 72, 79a with the screw 80 so as to be electrically conductive.

(Seventh Embodiment)

Figure 11:
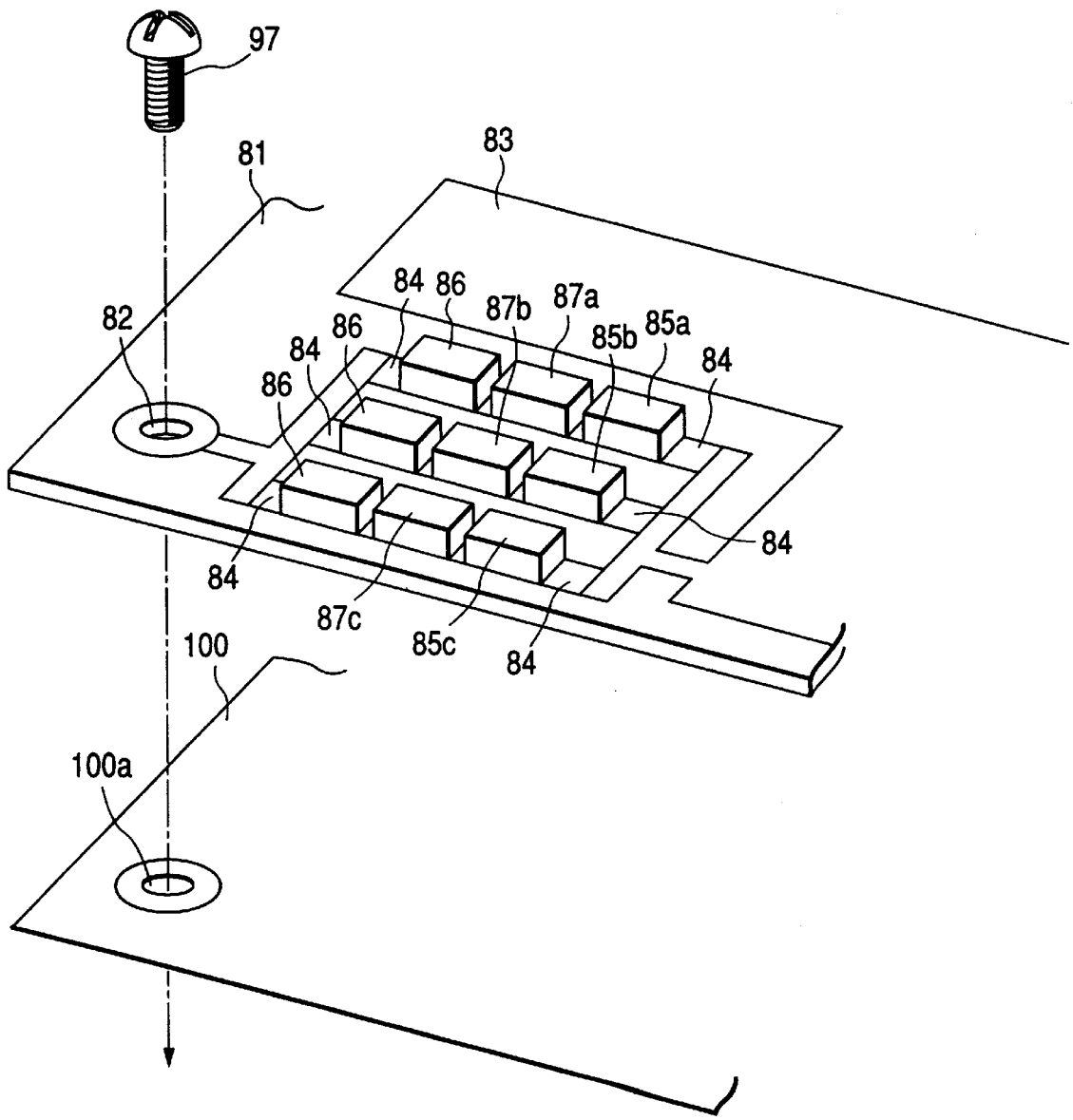
FIG. 11 is a perspective view to show the seventh embodiment of the connecting portion between a printed circuit board and a housing.

FIG. 11 is a perspective view to show the seventh embodiment of the connecting method for connecting the printed circuit board with the housing according to the present invention. This figure particularly shows the connecting portion between the ground of the printed circuit board and the conductive part of the housing. This embodiment shows an example in which they are connected through three separate paths with different impedances by configuring a parallel circuit of three RLC series circuits using chip type components in the connecting portion.

In FIG. 11, a land hole 82 for connection by screwing with the conductive part of housing 100 is provided in a part of printed circuit board 81. One ground pattern 83 electrically connected with the land hole 82 is discontinuous in part midway, and three pattern portions are connected in parallel between the separate patterns. On each of the pattern portions arranged in parallel, peeled portions are preliminarily formed and mounting lands 84 are provided in order to make possible soldering of chip type capacitor 85*a*–85*c*, chip type resistor 86, and chip type inductor 87*a*–87*c*.

Here, the resistors 86 have an identical resistance R0, and capacitances of the capacitors 85*a*–85*c* and the inductors 87*a*–87*c* decrease in the order of a, b, and c. Finally, the chip type capacitor 85*a*, chip type resistor 86, and chip type inductor 87*a*; the chip type capacitor 85*b*, chip type resistor 86, and the chip type inductor 87*b*; and the chip type capacitor 85*c*, chip type resistor 86, and chip type inductor 87*c* each are connected by soldering in series in the three respective pattern portions arranged in parallel. Numeral 100 denotes a conductive part of the housing, 100*a* a mounting hole, and 97 a screw.

The printed circuit board 81 is connected to the conductive part 100 of the housing through their holes 82, 100*a* with the screw 97 so as to be electrically conductive.

In the connecting method of the present embodiment as described above, the ground pattern portion 83 of the printed circuit board 81 and the conductive part of housing 100 are connected through the connecting portion wherein the RLC series circuits are arranged in parallel, whereby they are connected by the three separate electrical paths with different impedances, for impedance matching according to the frequency.

Figure 12:
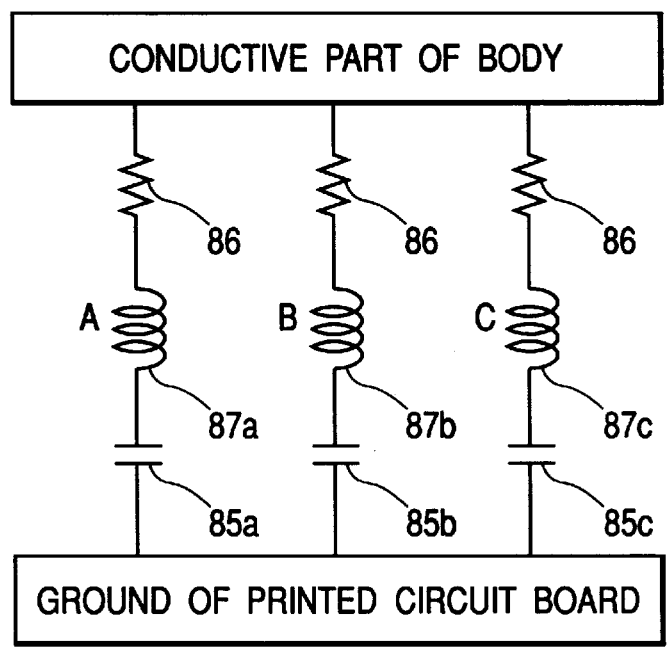
FIG. 12 is a schematic diagram of the connecting portion shown in FIG. 11.

The action by the connecting method of the present embodiment will be described below referring to FIG. 12 to FIG. 15. FIG. 12 is a schematic diagram of the connecting portion shown in FIG. 11 and FIG. 13 is a graph to show the frequency characteristics of the respective RLC series circuits shown in FIG. 12.

Figure 13:
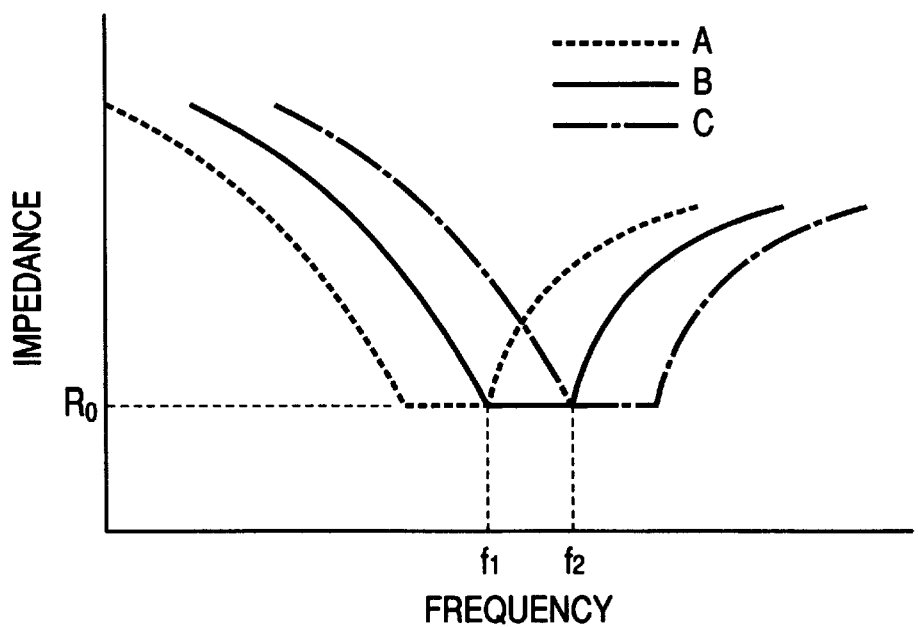
FIG. 13 is a graph to schematically show frequency characteristics of each RLC series circuit shown in FIG. 12.
Figure 14:
FIG. 14 is a drawing to show one RLC series circuit.
Figure 15:
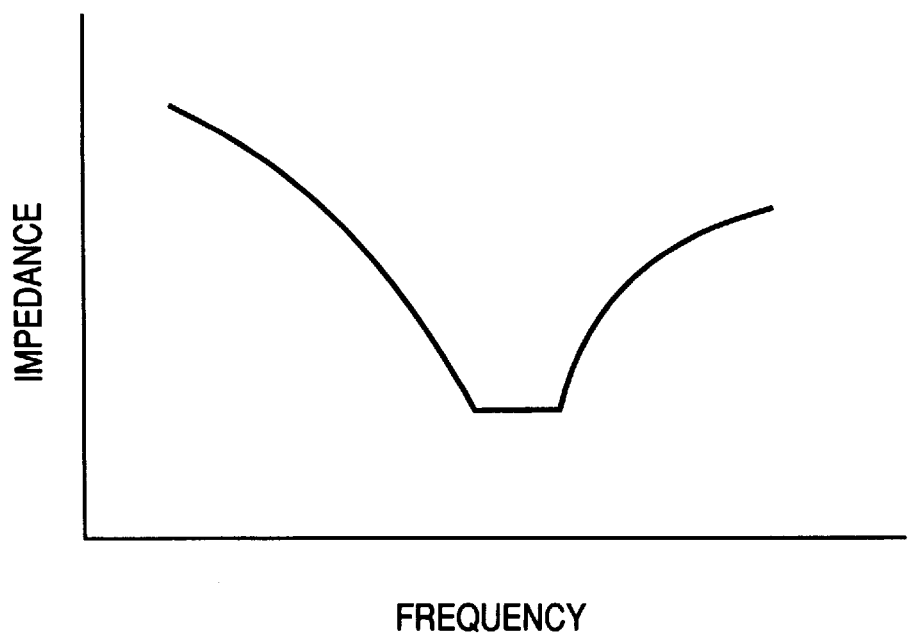
FIG. 15 is a graph to schematically show frequency characteristics of impedance of one RLC series circuit.

When the connection structure of the present embodiment is employed, that is, when the three RLC series circuits are connected in parallel as shown in FIG. 12, the impedance of the connecting portion has the frequency characteristics as shown in FIG. 13. In general, the impedance of one RLC series circuit as shown in FIG. 14 has the frequency characteristics as shown in the graph of FIG. 15.

The electric current flowing in the connecting portion of this embodiment passes through the circuit of A having the smallest combined impedance among the RLC series circuits in the frequency region smaller than the frequency f1 shown in FIG. 13; the current passes through the circuit of B between the frequencies f1 and f2; and the current passes through the circuit of C in the frequency region higher than the frequency f2 from the same reason. Since the impedance varies depending upon the frequency, it becomes possible to change the paths of electrical connection one from another. The change of the paths of connection makes it possible to adjust the impedance in the wider frequency region than in the configuration of one RLC series circuit as shown in FIG. 14. It is noted that the resistances of R in the present embodiment do not always have to be an identical value.

(Eighth Embodiment)

Figure 16:
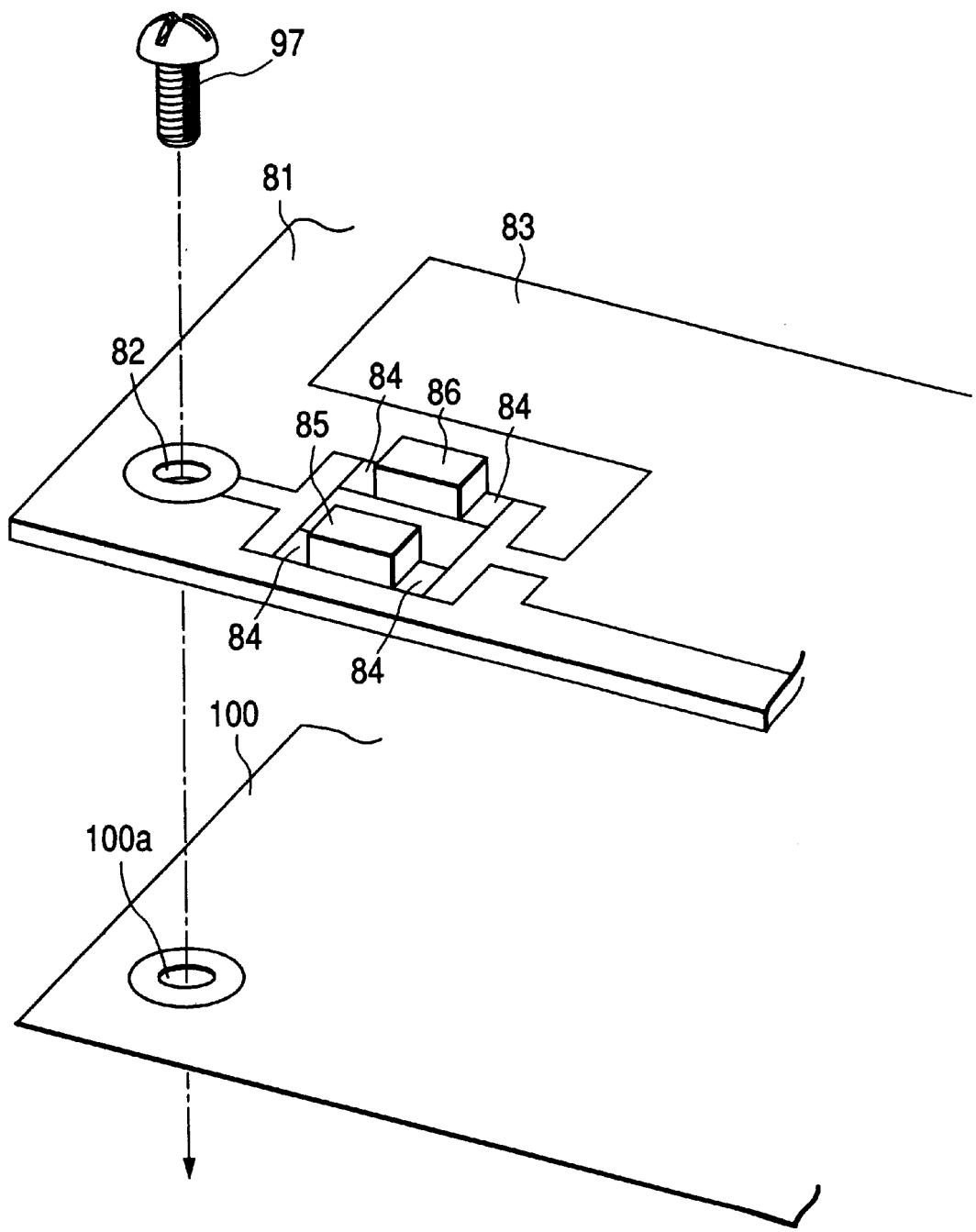
FIG. 16 is a perspective view to show the eighth embodiment of the connecting portion between a printed circuit board and a housing.

FIG. 16 is a perspective view to show the eighth embodiment of the connecting method between the printed circuit board and the housing according to the present invention. This figure particularly shows the connecting portion between the ground of the printed circuit board and the conductive part of the housing, and the same members as those in the seventh embodiment are denoted by the same reference symbols.

This embodiment shows an example in which they are connected by two separate paths with different impedances by forming an RC parallel circuit using chip type components in the connecting portion.

In FIG. 16, a land hole 82 for connection by screwing with the conductive part of housing 100 is provided in a part of printed circuit board 81. A part of one ground pattern 83 electrically connected to the land hole 82 is discontinuous midway and two pattern portions are connected in parallel between the separate patterns. On each of the pattern portions arranged in parallel, peeled portions are preliminarily formed and mounting lands 84 are provided in order to make possible soldering of chip type capacitor 85 and chip type resistor 86. Finally, the chip type capacitor 85 and chip type resistor 86 are connected by soldering in the two respective pattern portions arranged in parallel.

In the connecting method of the present embodiment as described above, the ground pattern portion 83 of the printed circuit board 81 and the conductive part of housing 100 are connected through the connecting portion comprised of the RC parallel circuit, whereby they are connected through either one of the two electrical paths having the different impedances, for the impedance adjustment according to the frequency. It can also be contemplated that they are connected through an LC parallel circuit using a chip type inductor instead of the chip type resistor 86.

Figure 17:
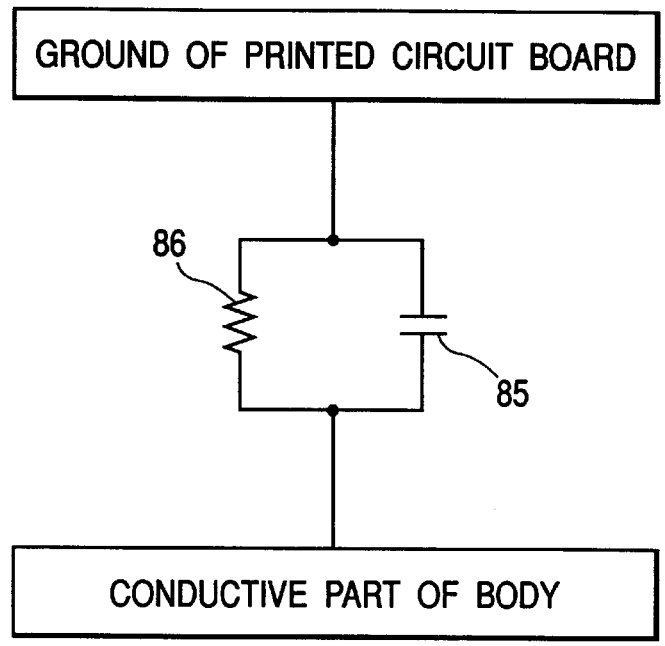
FIG. 17 is a schematic diagram of the connecting portion shown in FIG. 16.
Figure 18:
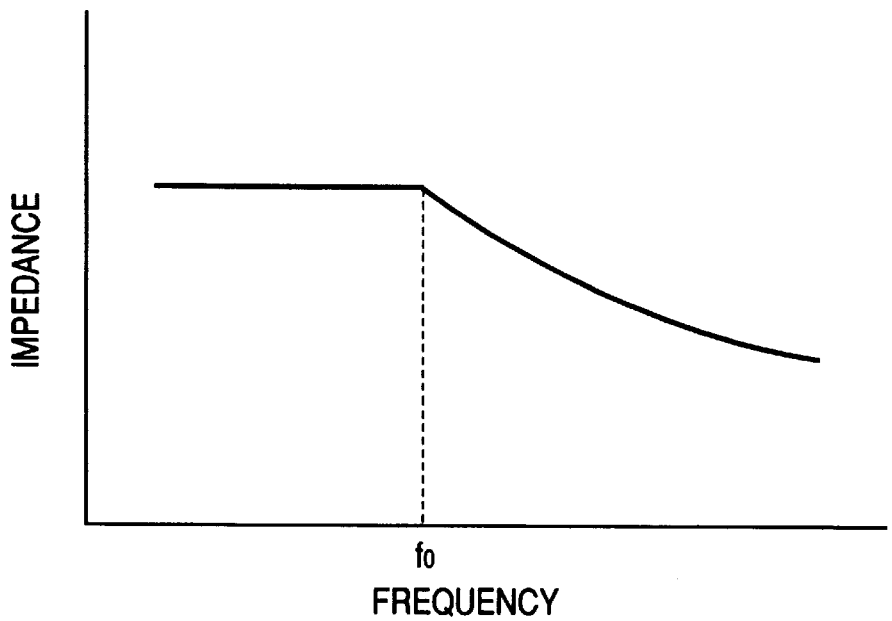
FIG. 18 is a graph to schematically show frequency characteristics of an RC parallel circuit shown in FIG. 17.

The action by the connecting method of the present embodiment will be described below referring to FIG. 17 and FIG. 18. FIG. 17 is a schematic diagram of the connecting portion shown in FIG. 16 and FIG. 18 is a graph to schematically show the frequency characteristics of the RC parallel circuit shown in FIG. 17. In FIG. 18, f0 indicates the frequency at which the impedances of R and C change one from another.

When the connection structure of the present embodiment is employed, that is, when the connecting portion is separated into the two paths using the RC parallel circuit as shown in FIG. 17, the impedance of the connecting portion has the frequency characteristics as shown in FIG. 18. Specifically, the impedance is high in the frequency region lower than the frequency f0 and the impedance is low in the frequency region higher than the frequency f0. Since the impedance varies depending upon the frequency, the paths of electrical connection can be changed one from another.

(Ninth Embodiment)

Figure 19:
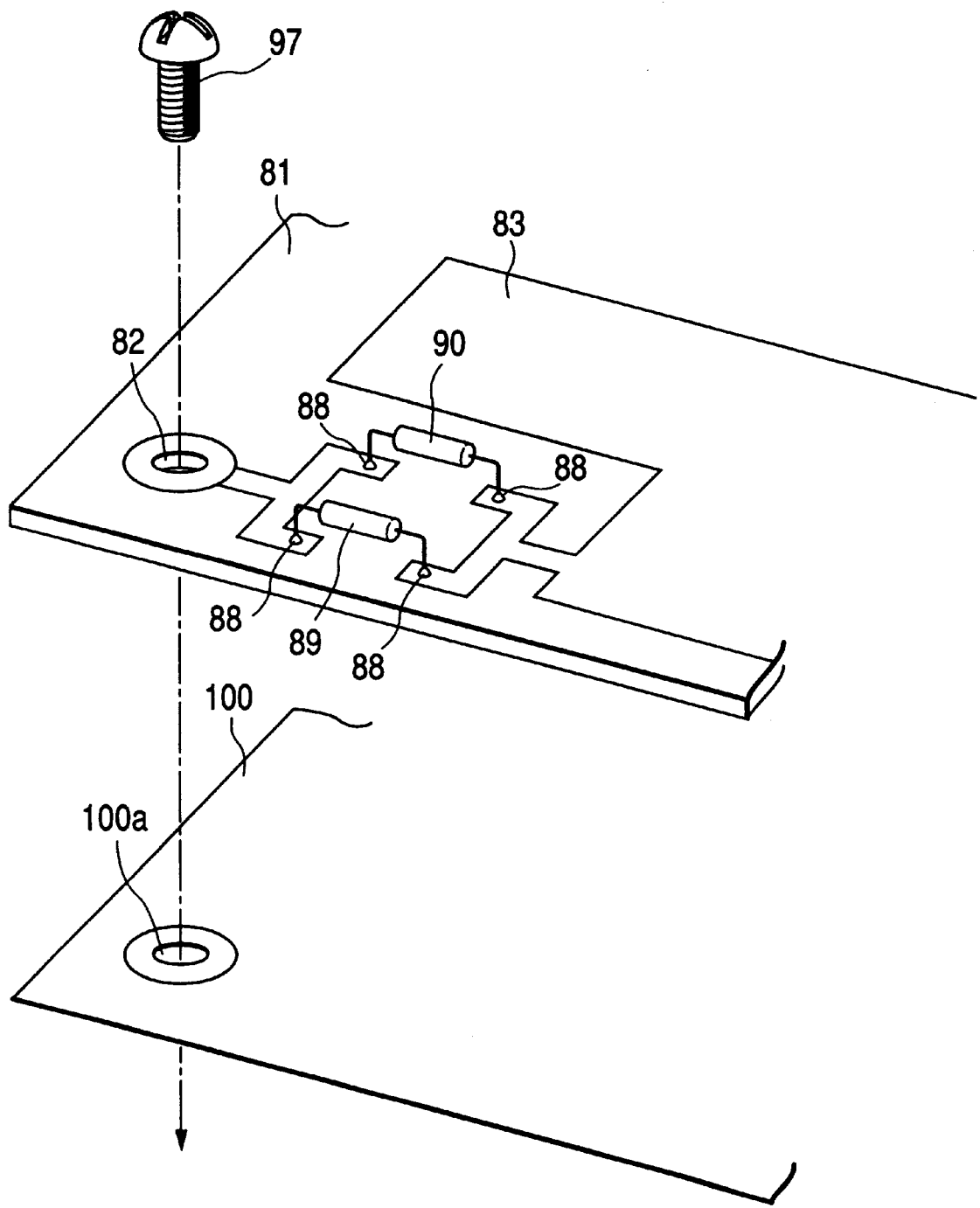
FIG. 19 is a perspective view to show the ninth embodiment of the connecting portion between a printed circuit board and a housing.

FIG. 19 is a perspective view to show the ninth embodiment of the connecting method between the printed circuit board and the housing according to the present invention. This figure particularly shows the connecting portion between the ground of the printed circuit board and the conductive part of the housing, and the same members as those in the seventh embodiment are denoted by the same reference symbols.

The present embodiment shows an example in which they are connected by two separate paths having different impedances by forming an RC parallel circuit using lead type components in the connecting portion.

In the present embodiment, as shown in FIG. 19, a part of one ground pattern 83 electrically connected to a land hole 82 is discontinuous midway and two patterns are connected in parallel between the separate patterns. On each of the pattern portions arranged in parallel, peeled portions are preliminarily formed and through hole lands 88 are provided in order to make possible soldering of lead type capacitor 89 and lead type resistor 90. Finally, the lead type capacitor 89 and lead type resistor 90 are connected by soldering in the two respective pattern portions arranged in parallel.

In the connecting method of the present embodiment as described above, the ground pattern portion 83 of the printed circuit board 81 and the conductive part of housing 100 are connected through the connecting portion comprised of the RC parallel circuit using the lead type components, whereby they are connected through either one of the two electrical paths having the different impedances, for the impedance adjustment according to the frequency. It can also be contemplated that they are connected through an LC parallel circuit using a lead type inductor instead of the lead type resistor 90.

(Tenth Embodiment)

Figure 20:
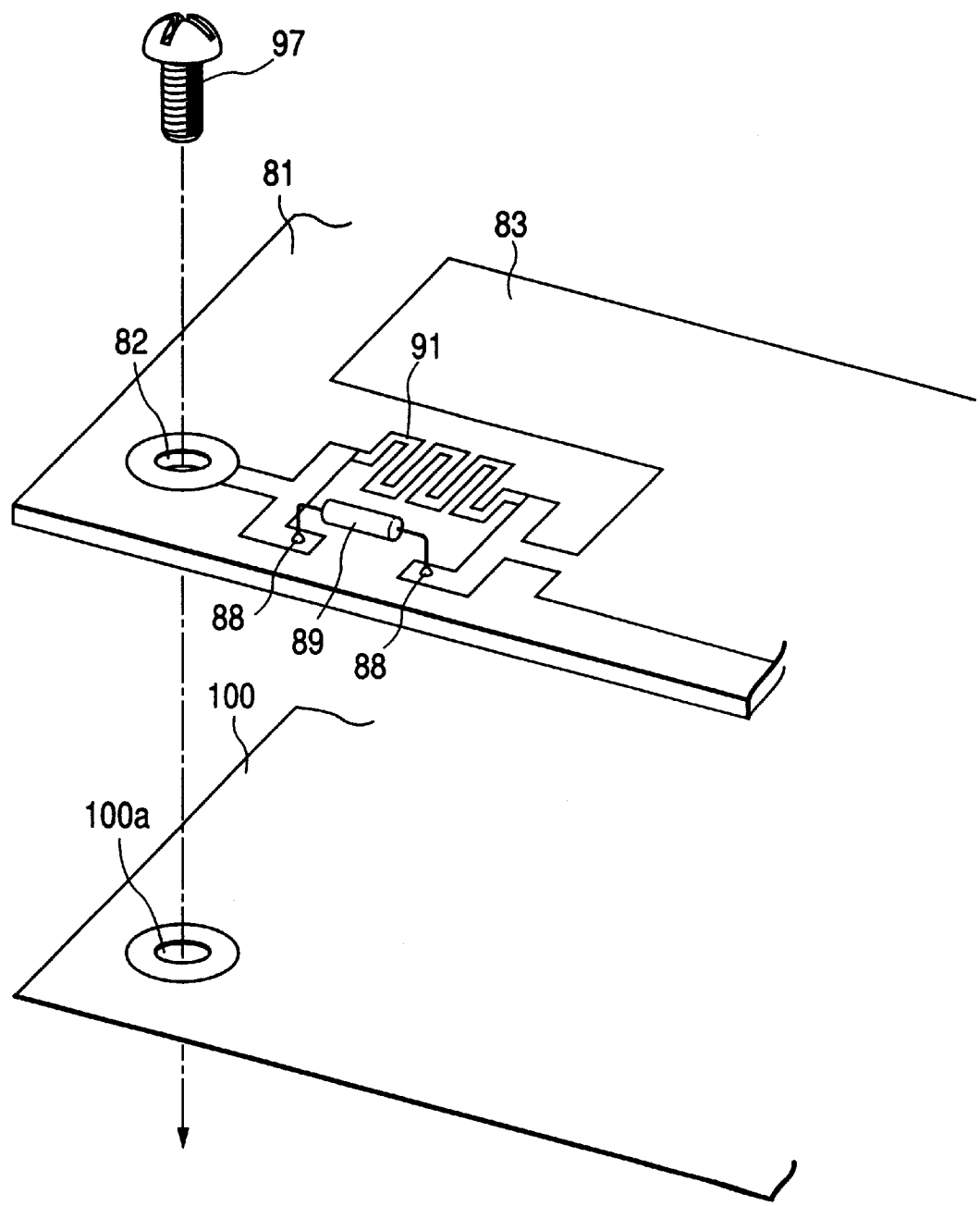
FIG. 20 is a perspective view to show the tenth embodiment of the connecting portion between a printed circuit board and a housing.

FIG. 20 is a perspective view to show the tenth embodiment of the connecting method between the printed circuit board and the housing according to the present invention. This figure particularly shows the connecting portion between the ground of the printed circuit board and the conductive part of the housing, and the same members as those in the seventh embodiment are denoted by the same reference symbols.

The present embodiment shows an example in which they are connected through two separate paths having different impedances by forming an LC parallel circuit including a printed inductor of a folded pattern in the connecting portion.

In the present embodiment, as shown in FIG. 20, one ground pattern 83 electrically connected with the land hole 82 is discontinuous midway and two pattern portions are connected in parallel between the separate patterns. On one of the two pattern portions, a peeled portion is preliminarily formed and through hole lands 88 are provided in order to make soldering of lead type capacitor 89 possible. On the other pattern portion a printed inductor 91 of the folded pattern is formed. Finally, the lead type capacitor 89 is connected by soldering to the through hole lands 88 of the one pattern portion.

Figure 21:
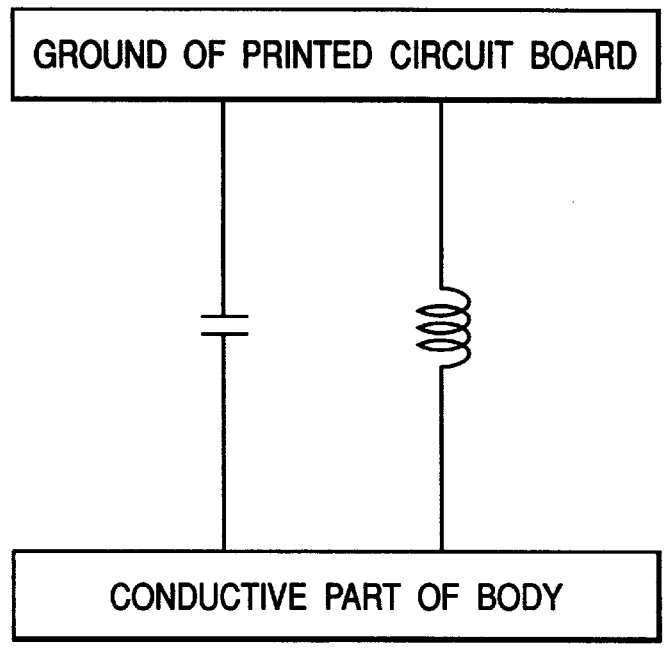
FIG. 21 is a schematic diagram of the connecting portion shown in FIG. 20.
Figure 22:
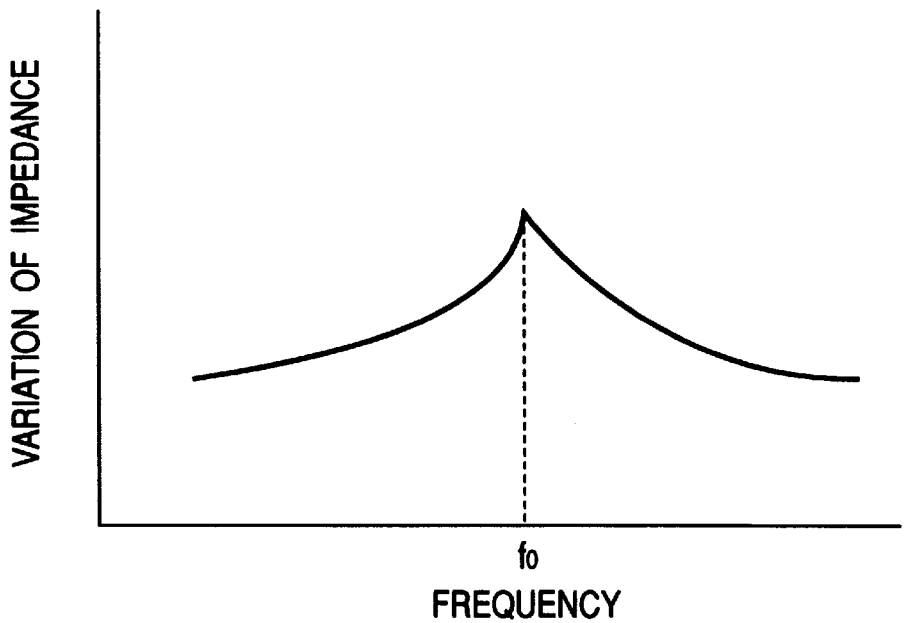
FIG. 22 is a graph to schematically show frequency characteristics of an LC parallel circuit shown in FIG. 21.

The action by the connecting method of the present embodiment will be described below referring to FIG. 21 and FIG. 22. FIG. 21 is a schematic diagram of the connecting portion shown in FIG. 20 and FIG. 22 is a graph to schematically show the frequency characteristics of the LC parallel circuit shown in FIG. 21. In FIG. 22, f0 indicates the frequency at which the impedances of L and C change one from another.

When the connection structure of the present embodiment is employed, that is, when the connecting portion is separated into the two paths by the RC parallel circuit as shown in FIG. 21, the impedance of the connecting portion has the frequency characteristics as shown in FIG. 22. Specifically, as shown in FIG. 22, since the impedance of the inductor L is smaller than that of capacitor C in the frequency region lower than f0, the current flows through the inductor L side; inversely, the current flows through the capacitor C side in the frequency region higher than f0. Therefore, the paths can be changed one from another.

(Eleventh Embodiment)

Figure 23:
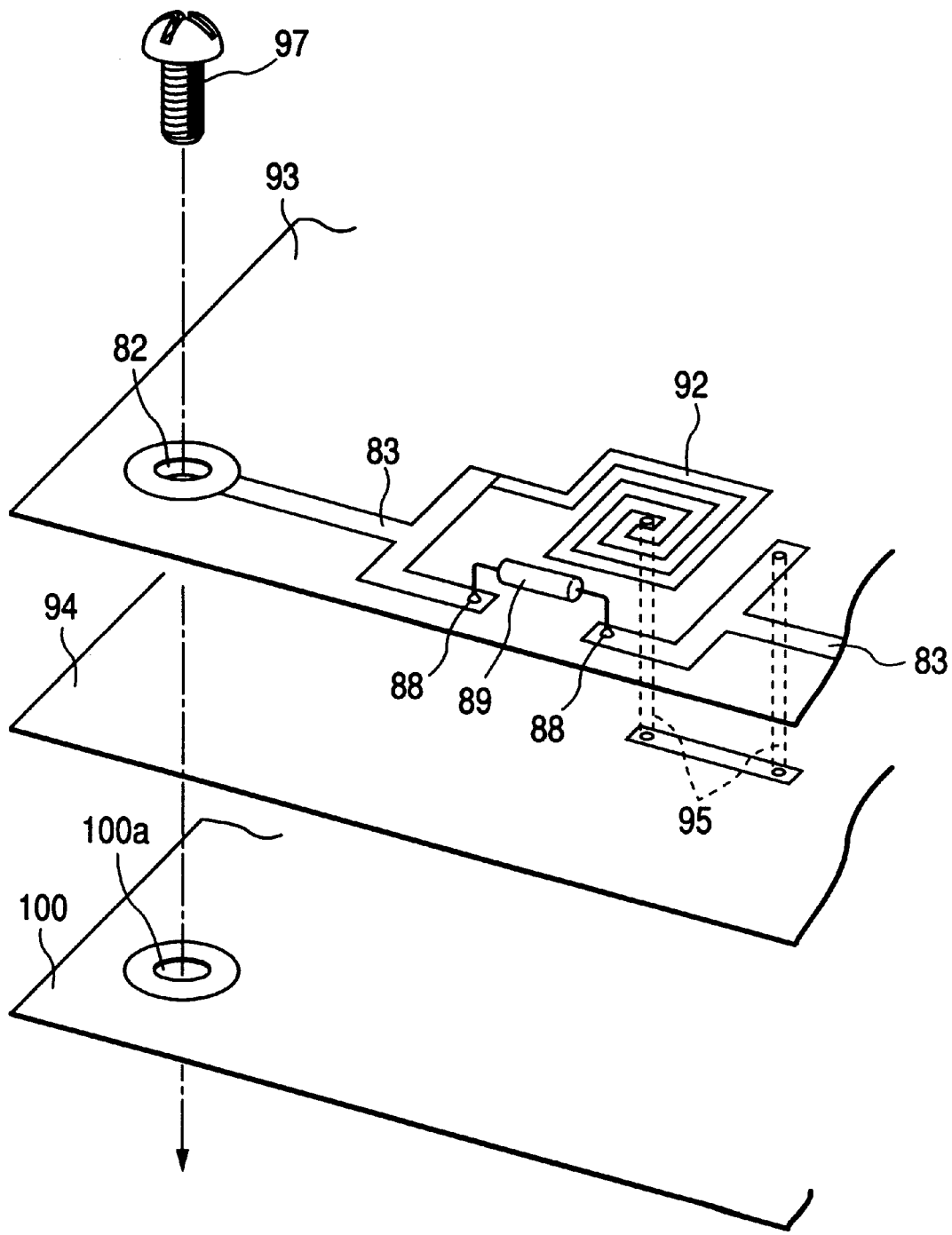
FIG. 23 is a perspective view to show the eleventh embodiment of the connecting portion between a printed circuit board and a housing.

FIG. 23 is a perspective view to show the eleventh embodiment of the connecting method between the printed circuit board and the housing according to the present invention. This figure particularly shows the connecting portion between the ground of the printed circuit board and the conductive part of the housing.

The present embodiment shows an example in which they are connected through two separate paths having different impedances by forming an LC parallel circuit including a printed inductor of a spiral shape, instead of the printed inductor of the folded pattern, in the connecting portion.

In FIG. 23, a land hole 82 for connection by screwing with the conductive part of housing 100 is provided in a part of the printed circuit board. The land hole 82 is electrically connected with a part of ground pattern 83 in a wiring forming layer 93 in the top surface, the bottom surface, or the substrate of the printed circuit board. A part of this one ground pattern 83 is discontinuous midway and two pattern portions are connected in parallel between the separate patterns. On one of the two pattern portions, a peeled portion is preliminarily formed and through hole lands 88 are provided in order to make soldering of lead type capacitor 89 possible. A printed inductor 92 of a spiral shape is formed on the other pattern portion. Finally, a lead type capacitor 89 is connected by soldering to the through hole lands 88 on one pattern portion.

In this example, the end of the printed inductor 92 in the center of the spiral pattern may be connected to the ground pattern through a wiring forming layer 94, different from the wiring forming layer 93, and through holes 95.

(Twelfth Embodiment)

Figure 24:
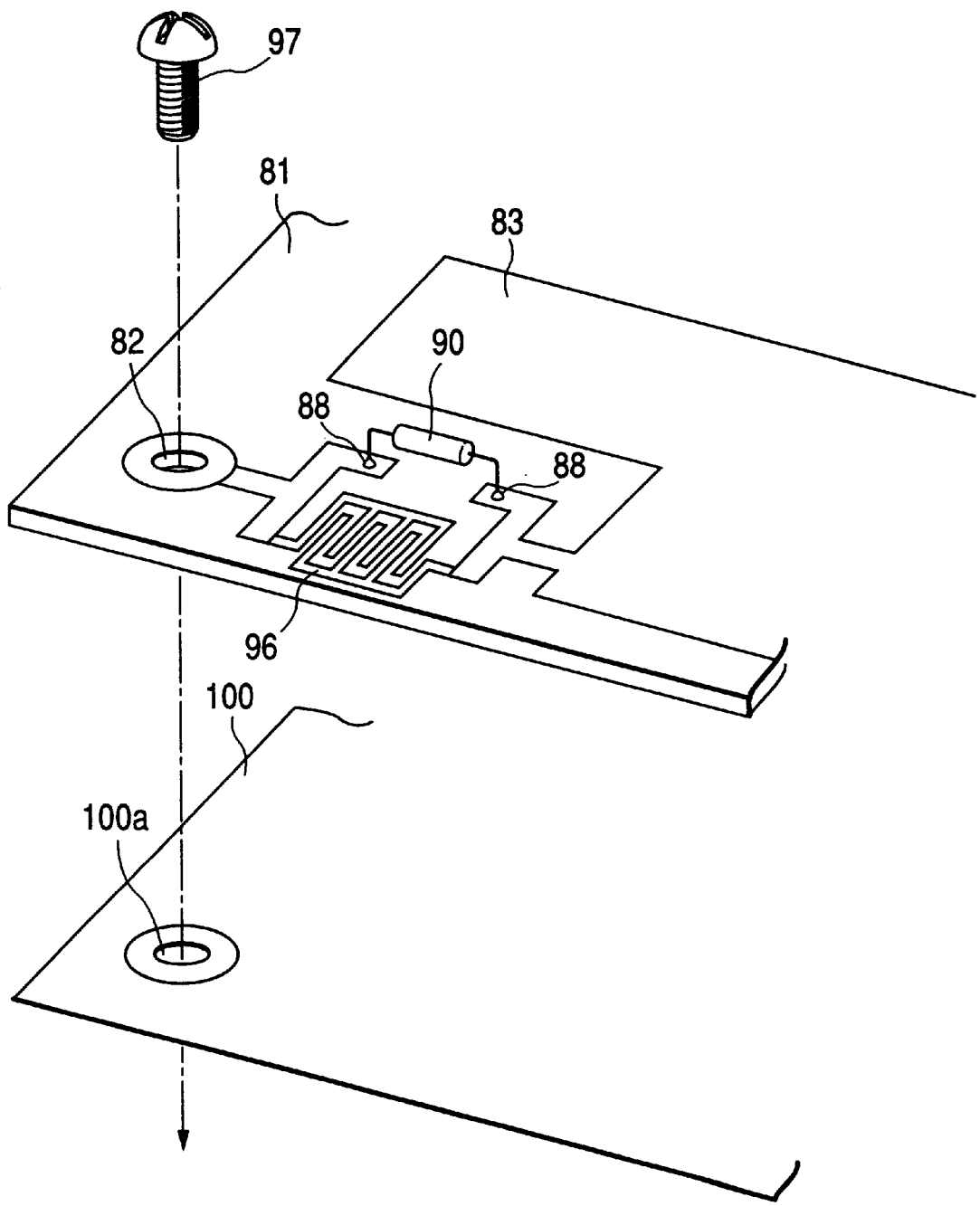
FIG. 24 is a perspective view to show the twelfth embodiment of the connecting portion between a printed circuit board and a housing.

FIG. 24 is a perspective view to show the twelfth embodiment of the connecting method between the printed circuit board and the housing according to the present invention. This figure particularly shows the connecting portion between the ground of the printed circuit board and the conductive part of the housing.

The present embodiment shows an example in which they are connected through two separate paths having different impedances by forming an RC parallel circuit including a printed capacitor of an interdigital pattern in the connecting portion.

In the present embodiment, as shown in FIG. 24, one ground pattern 83 electrically connected with the land hole 82 is discontinuous midway and two pattern portions are connected in parallel between the separate patterns. On one of the two pattern portions, a peeled portion is preliminarily formed and through hole lands 88 are provided in order to make soldering of lead type resistor 90 possible. On the other pattern portion a printed capacitor 96 of the interdigital pattern is formed. Finally, the lead type resistor 90 is connected by soldering to the through hole lands 88 of the one pattern portion.

The present embodiment is the example in which the ground portion of the circuit board and the conductive part of the housing 100 are connected through the RC parallel circuit.

(Thirteenth Embodiment)

Figure 25:
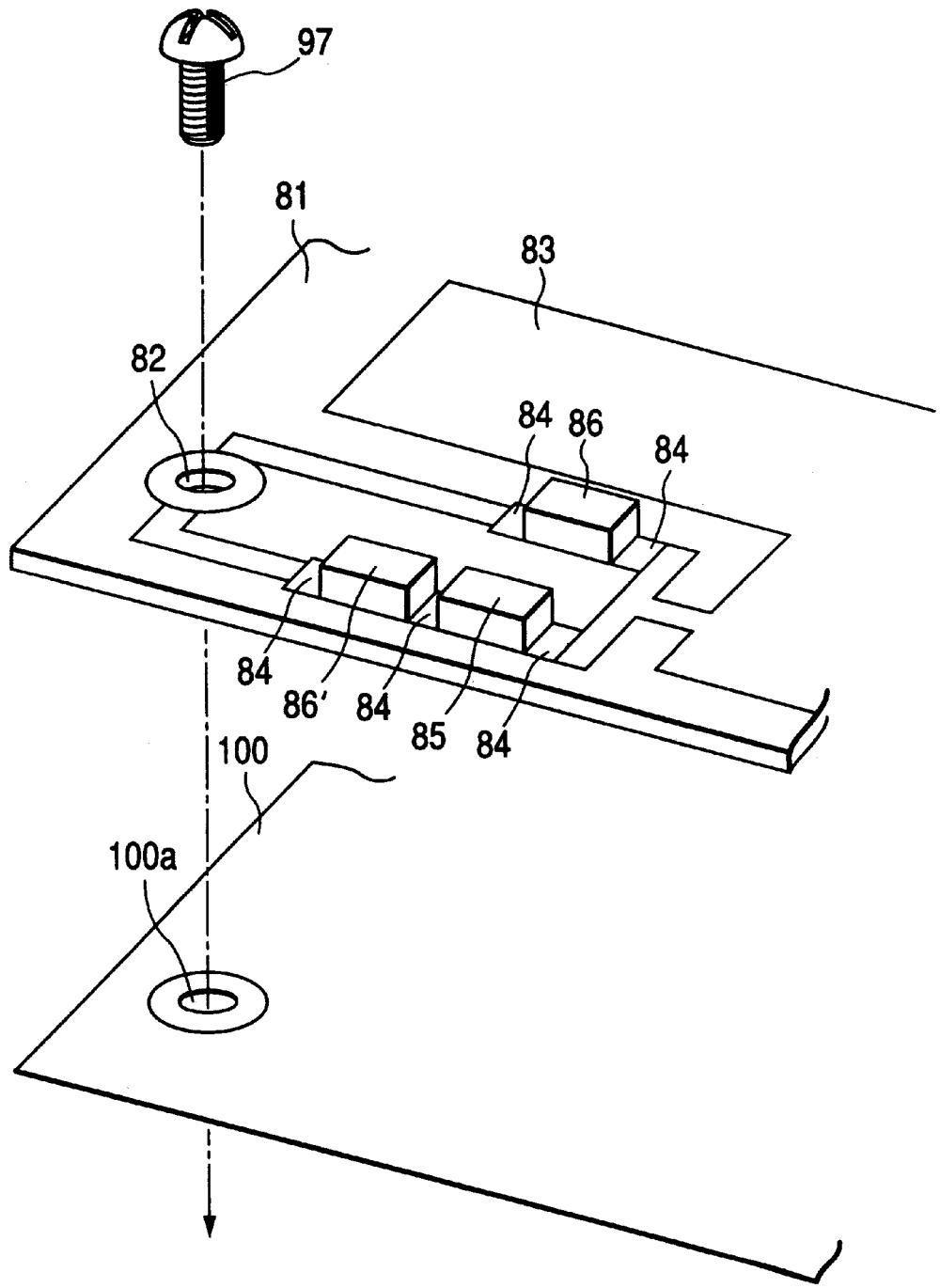
FIG. 25 is a perspective view to show the thirteenth embodiment of the connecting portion between a printed circuit board and a housing.

FIG. 25 is a perspective view to show the thirteenth embodiment of the connecting method between the printed circuit board and the housing according to the present invention. This figure particularly shows the connecting portion between the ground of the printed circuit board and the conductive part of the housing.

The present embodiment shows an example in which they are connected through two separate paths having different impedances by forming a parallel circuit using chip type components, the parallel circuit being composed of a series circuit of a resistor and a capacitor, and a resistor having a resistance different from that of the first resistor.

In FIG. 25, a land hole 82 for connection by screwing with the conductive part of housing 100 is provided in a part of printed circuit board 81. A part of one ground pattern 83 electrically connected with the land hole 82 is discontinuous midway, and two pattern portions are connected in parallel between the separate patterns. On one of the two pattern portions arranged in parallel, a peeled portion is preliminarily formed and mounting lands 84 are provided in order to make soldering of chip type resistor 86 possible. On the other pattern portion, peeled portions and mounting lands 84 are preliminarily formed in order to make possible soldering of chip type capacitor 85 and chip type resistor 86'. Finally, the chip type resistor 86 is connected by soldering to the mounting lands 84 on the one pattern portion. The chip type capacitor 85 and chip type resistor 86' are connected by soldering to the mounting lands 84 on the other pattern portion.

In this connecting method, connection is made with a higher impedance through the path on the chip type resistor 86 side in the low frequency region, while in the high frequency region connection is made with a lower impedance through the path on the chip type resistor 86' side than through the path on the chip type resistor 86 side, because the current flows through the path including the chip type capacitor 85 in the high frequency region.

(Fourteenth Embodiment)

Figure 26:
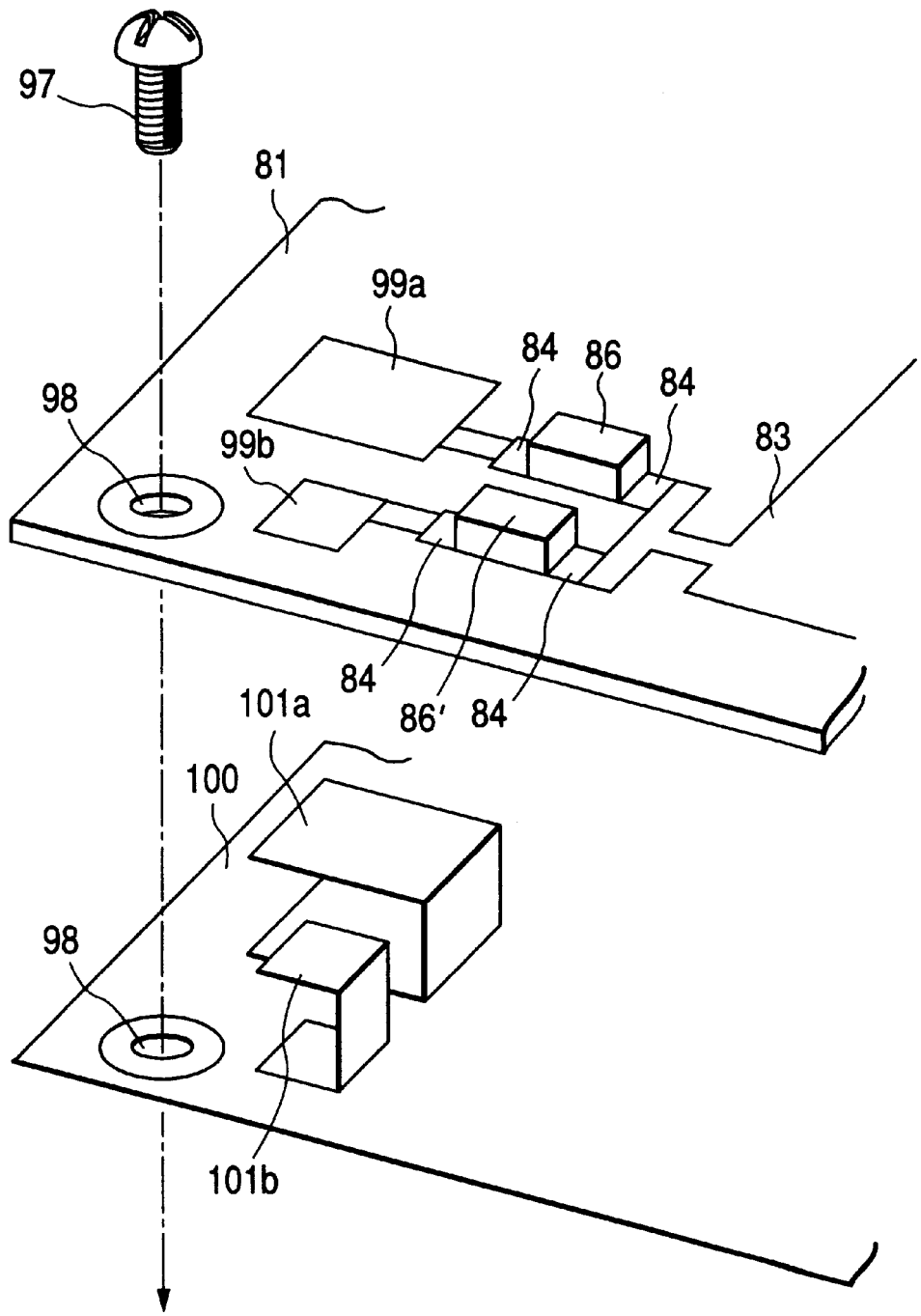
FIG. 26 is a perspective view to show the fourteenth embodiment of the connecting portion between a printed circuit board and a housing.
Figure 27:
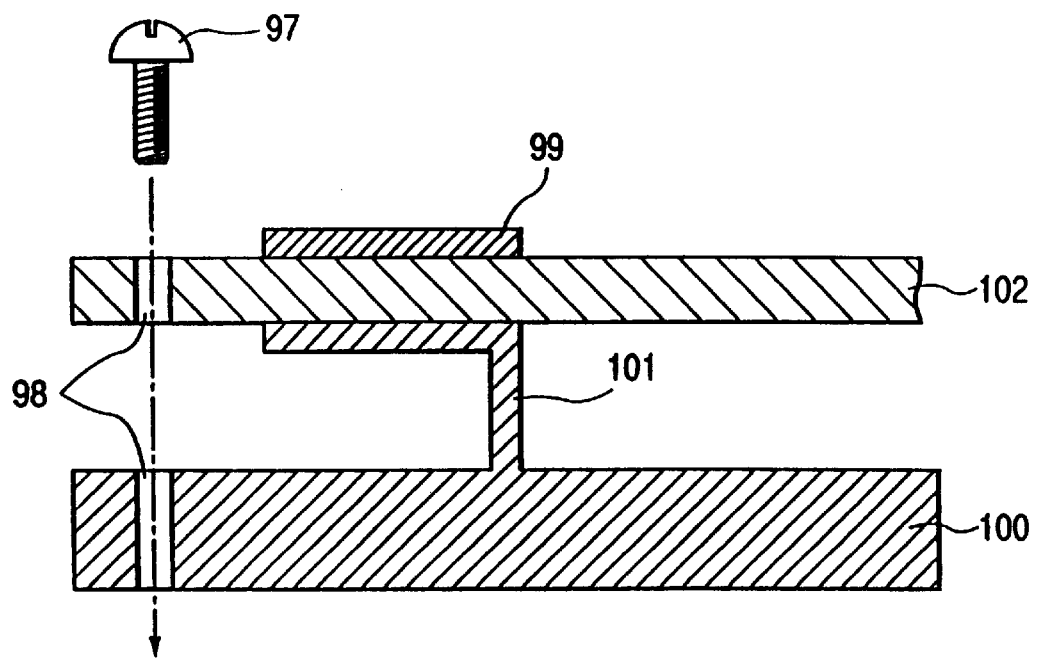
FIG. 27 is a cross-sectional view to show a connecting state between the printed circuit board and the housing conductive part shown in FIG. 26.
Figure 29:
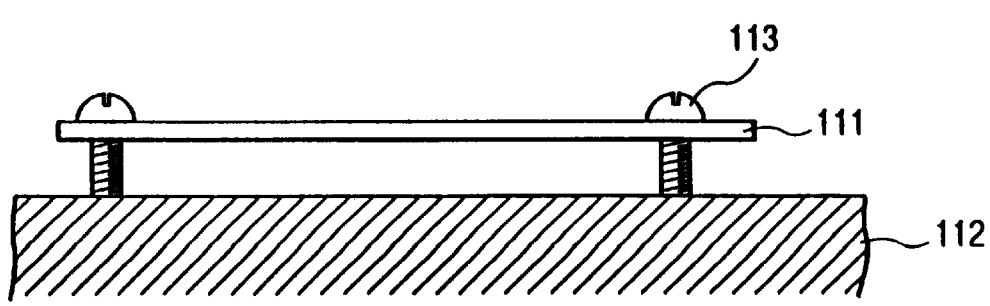
FIG. 29 is a partial side view of the connecting portion of the printed circuit board with the housing in the conventional example.

FIG. 26 is a perspective view to show the fourteenth embodiment of the connecting method between the printed circuit board and the housing according to the present invention. This figure particularly shows the connecting portion between the ground of the printed circuit board and the conductive part of the housing. FIG. 27 is a cross-sectional view to show a connection state between the printed circuit board and the conductive part of the housing shown in FIG. 26.

The present embodiment shows an example in which they are connected through two separate paths having different impedances by branching connection pattern portions having two different areas out of a part of the ground pattern in the wiring forming layer of the printed circuit board, placing rising portions of the housing corresponding to the respective ground pattern portions through the dielectric of the printed circuit board, and forming two RC series circuits mounted with a chip type component in each ground pattern portion branched out, in the connecting portion.

In FIG. 26, a screw mounting hole 98 for fixing the board to the conductive part 100 of the housing with a screw 97 is provided in a part of printed circuit board 81. Two ground patterns are drawn in parallel from a part of the ground pattern 83 near the land hole 98. On one ground pattern thus drawn, a peeled portion is preliminarily formed and mounting lands 84 are provided in order to make soldering of chip type resistor 86 possible. On the other ground pattern, a peeled portion is preliminarily formed and mounting lands 84 are provided in order to make soldering of chip type resistor 86' possible. Finally, the chip type resistor 86 is connected by soldering to the mounting lands 84 on one ground pattern drawn out, while the chip type resistor 86' is connected by soldering to the other ground pattern.

Further, a pattern 99a for connection having a predetermined area S1 is formed at the end of one ground pattern drawn out, and a pattern 99b for connection having a predetermined area S2 at the end of the other ground pattern. Rising portions 101a and 101b having their respective areas S1 and S2 are preliminarily produced corresponding to the connection patterns 99a and 99b on the conductive part 100 of the housing. Then the connection patterns 99 and the rising portions 101 of the conductive part 100 of the housing are made to face each other through the dielectric 102 of the printed circuit board by fixation by screwing, as shown in FIG. 27.

This connection causes the facing portions to have the capacitive nature expressed by the following equation, depending upon the area S1 and S2.

C=εS/d

In the equation C represents the capacitance, S the area, ε the dielectric constant of the dielectric, and d the thickness of the dielectric.

When the two connection paths are given and the connection patterns and the rising portions of the conductive part of housing are opposed to each other as described above, electrical connection can be made with different capacitances.

In this example, the capacitances of the connecting portion may be adjusted by interposing another dielectric between the rising portions 101 of the conductive part 100 of the housing and the printed circuit board 81. The screwing portion does not have to be in the conductive part of the housing.

(Fifteenth Embodiment)

Figure 28:
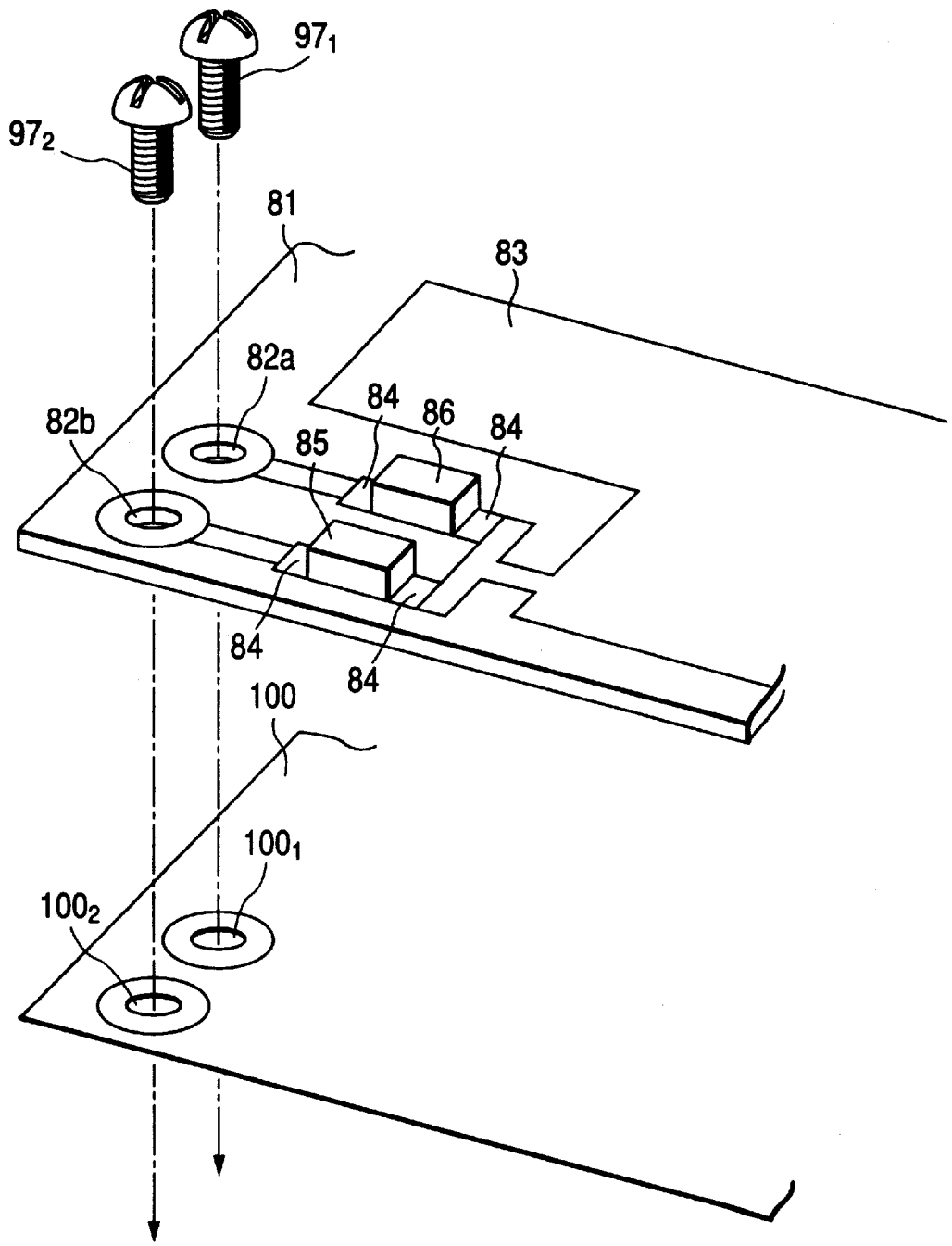
FIG. 28 is a perspective view to show the fifteenth embodiment of the connecting portion between a printed circuit board and a housing.

FIG. 28 is a perspective view to show the fifteenth embodiment of the connecting method between the printed circuit board and the housing according to the present invention. This figure particularly shows the connecting portion between the ground of the printed circuit board and the conductive part of the housing. The present embodiment shows an example having two connecting portions to form separate connection paths.

In FIG. 28, land holes 82a and 82b for connection by screwing with screws $97_1$, $97_2$ to holes $100_1$, $100_2$ of the conductive part 100 of housing are provided in a part of printed circuit board 81. A part of two ground patterns drawn out of the land pattern 83 and respectively connected to the land holes 82a and 82b is discontinuous each midway. On one ground pattern a peeled portion is preliminarily formed and mounting lands 84 are provided in order to make soldering of chip type resistor 86 possible. On the other ground pattern a peeled portion is preliminarily formed and mounting lands 84 are provided in order to make soldering of chip type capacitor 85 possible. Finally, the chip type resistor 86 is connected by soldering to the mounting lands 84 on the one ground pattern, while the chip type capacitor 85 is connected by soldering to the other ground pattern.

The connection paths can be changed one from another by this configuration wherein the wire is drawn to each of the two connecting portions (the land holes 82a and 82b) from the ground pattern 81 of the printed circuit board 81 and wherein the circuits with different impedances are configured as described above.

As described above, the present invention can suppress the radiant noise due to the standing wave appearing upon the connection to the housing and can lower the level of radiant noise in the broad frequency region, by configuring the LC series circuit in the connecting portion between the ground pattern and the conductive part of the instrument housing, in the printed circuit board having the ground pattern.

Particularly, the configuration of the RC circuit in the connecting portion can suppress the radiant noise in the low frequency region, and the configuration of the RLC circuit can facilitate adjustment of impedance of the connecting portion at the resonance frequency, thereby suppressing the radiant noise caused by the connection to the housing more readily.

As described above, the present invention makes possible adjustment of impedance in the connecting portion against frequency to achieve effective countermeasures against the radiant noise throughout the wide frequency region, by configuring the plural connecting paths with different impedances in the connecting portion between the ground portion of the printed circuit board and the conductive part of the instrument housing.

What is claimed is:

1. A connection structure between a printed circuit board of an electronic instrument and a housing of the instrument, comprising:

a conductive part of the housing of the instrument as a housing ground;

a printed circuit board having a ground pattern, said ground pattern of the printed circuit board being separated into a ground pattern for signal and a ground pattern for connection with said conductive part of the housing of the instrument;

a connecting member for electrically connecting said conductive part of the housing of the instrument with the ground pattern for connection; and a component permitting an impedance thereof to be set, said component being connected between said ground pattern for signal and said ground pattern for connection, said component suppressing radiant noise, wherein said component comprises components having at least two of inductive nature, capacitive nature, and resistive nature and connected in series.

2. A connection structure between a printed circuit board of an electronic instrument and a housing of the instrument according to claim 1, wherein said component having the inductive nature is a printed inductor formed in said ground pattern for connection.

3. A connection structure between a printed circuit board of an electronic instrument and a housing of the instrument according to claim 2, wherein a pattern of said printed inductor is a folded pattern.

4. A connection structure between a printed circuit board of an electronic instrument and a housing of the instrument according to claim 2, wherein a pattern of said printed inductor is a spiral pattern.

5. A connection structure between a printed circuit board of an electronic instrument and a housing of the instrument according to claim 1, wherein said components having at least two of the inductive nature, capacitive nature, and resistive nature and connected in series are lead type electronic components, said lead type electronic components being mounted on through hole lands provided in said ground pattern for connection.

6. A connection structure between a printed circuit board of an electronic instrument and a housing of the instrument according to claim 4, wherein said components having at least two of the inductive nature, capacitive nature, and resistive nature and connected in series are chip type electronic components, said chip type electronic components being mounted on mounting lands provided in said ground pattern for connection.

7. A connection structure between a printed circuit board of an electronic instrument and a housing of the instrument according to claim 1, wherein said component having the capacitive nature is a printed capacitor formed in said ground pattern for connection.

8. A connection structure between a printed circuit board of an electronic instrument and a housing of the instrument according to claim 7, wherein said printed capacitor is of an interdigital pattern.

9. A connection structure between a printed circuit board of an electronic instrument and a housing of the instrument, comprising:

a conductive part of the housing of the instrument as a housing ground;

a printed circuit board having a ground pattern, said around pattern of the printed circuit board being separated into a ground pattern for signal and a around pattern for connection with said conductive part of the housing of the instrument;

a connecting member for electrically connecting said conductive part of the housing of the instrument with the ground pattern for connection; and a component permitting an impedance thereof to be set, said component being connected between said ground pattern for signal and said around pattern for connection, said component suppressing radiant noise, wherein said component comprises components having at least two of inductive nature, capacitive nature, and resistive nature and connected in series, wherein said component having the capacitive nature is a printed capacitor formed in said ground pattern for connection, and wherein said ground pattern for connection is separated from said ground pattern for signal, and wherein said printed capacitor is formed by placing a peripheral part of said ground pattern for connection and a peripheral part of said ground pattern for signal thus separated opposite to and close to each other across a predetermined length.

10. A connection structure between a printed circuit board of an electronic instrument and a housing of the instrument, comprising:

a conductive part of the housing of the instrument as a housing ground;

a printed circuit board having a around pattern, said ground pattern of the printed circuit board being separated into a ground pattern for signal and a ground pattern for connection with said conductive part of the housing of the instrument;

a connecting member for electrically connecting said conductive part of the housing of the instrument with the around pattern for connection; and a plurality of connection paths with different impedances, connected in parallel between said ground pattern for signal and said ground pattern for connection, wherein each of said plurality of connection paths comprises components having inductive nature, capacitive nature, and resistive nature and connected in series.

11. A connection structure between a printed circuit board of an electronic instrument and a housing of the instrument, comprising:

a conductive part of the housing of the instrument as a housing ground;

a printed circuit board having a ground pattern, said ground pattern of the printed circuit board being separated into a ground pattern for signal and a ground pattern for connection with said conductive part of the housing of the instrument;

a connecting member for electrically connecting said conductive part of the housing of the instrument with the ground pattern for connection; and a plurality of connection paths with different impedances, connected in parallel between said ground pattern for signal and said ground pattern for connection, wherein said plurality of connection paths comprise components having at least one of inductive nature, capacitive nature, and resistive nature.

12. A connection structure between a printed circuit board of an electronic instrument and a housing of the instrument according to claim 11, wherein said plurality of connection paths have a plurality of mounting lands, and said components are chip type electronic components, said chip type electronic components being mounted on said mounting lands.

13. A connection structure between a printed circuit board of an electronic instrument and a housing of the instrument according to claim 11, wherein said plurality of connection paths have a plurality of through hole lands, and said components are lead type electronic components, said lead type electronic components being mounted on said through hole lands.

14. A connection structure between a printed circuit board of an electronic instrument and a housing of the instrument according to claim 11, wherein said component having the inductive nature is a printed inductor formed in said ground pattern for connection.

15. A connection structure between a printed circuit board of an electronic instrument and a housing of the instrument according to claim 14, wherein a pattern of said printed inductor is a folded pattern.

16. A connection structure between a printed circuit board of an electronic instrument and a housing of the instrument according to claim 14, wherein a pattern of said printed inductor is a spiral pattern.

17. A connection structure between a printed circuit board of an electronic instrument and a housing of the instrument according to claim 11, wherein said component having the capacitive nature is a printed capacitor formed in said ground pattern for connection.

18. A connection structure between a printed circuit board of an electronic instrument and a housing of the instrument according to claim 17, wherein said printed capacitor is of an interdigital pattern.

19. A connection structure between a printed circuit board of an electronic instrument and a housing of the instrument according to claim 11, wherein at least one connection path has a capacitive nature or, in the alternative, in which a component having an inductive nature or a resistive nature is connected to another connection path.

20. A connection structure between a printed circuit board of an electronic instrument and a housing of the instrument, comprising:

a conductive part of the housing of the instrument as a housing ground;

a printed circuit board having a ground pattern, said ground pattern of the printed circuit board being separated into a ground pattern for signal and a ground pattern for connection with said conductive part of the housing of the instrument;

a connecting member for electrically connecting said conductive part of the housing of the instrument with the ground pattern for connection; and a plurality of connection paths with different impedances, connected in parallel between said ground pattern for signal and said ground pattern for connection, wherein said plurality of connection paths comprises components having at least two of inductive nature, capacitive nature, and resistive nature and connected in series.

21. A connection structure between a printed circuit board of an electronic instrument and a housing of the instrument, comprising:

a conductive part of the housing of the instrument as a housing ground, wherein rising portions are formed in the conductive part of the housing of the instrument;

a printed circuit board having a ground pattern, said ground pattern of the printed circuit board having a plurality of mounting lands and a plurality of connection patterns, said connection patterns being opposed to said rising portions of the conductive part of the housing of the instrument so as to achieve capacitive nature;

components mounted on said plurality of mounting lands, said components having inductive nature or resistive nature; and a connecting member for connecting said conductive part of the housing of the instrument with said ground pattern for connection.

* * * * *

UNITED STATES PATENT AND TRADEMARK OFFICE
CERTIFICATE OF CORRECTION

PATENT NO. : 6,016,084
DATED : January 18, 2000
INVENTOR(S) : Satoshi Sugimoto

Page 1 of 1

It is certified that error appears in the above-identified patent and that said Letters Patent is hereby corrected as shown below:

Column 1,
Line 54, "of" should be deleted.

Column 9,
Line 49, "reason." should read -- region. --.

Column 15,
Line 42, "claim 4," should read -- claim 1, --.
Line 64, "around" should read -- ground --.
Line 65, "around" should read -- ground --.

Column 16,
Line 6, "around" should read -- ground --.
Line 26, "around" should read -- ground --.
Line 34, "around" should read -- ground --.

Signed and Sealed this

Twenty-first Day of August, 2001

*Attest:*

NICHOLAS P. GODICI
*Attesting Officer*  *Acting Director of the United States Patent and Trademark Office*